(12) United States Patent
Lee et al.

(10) Patent No.: US 8,324,733 B2
(45) Date of Patent: Dec. 4, 2012

(54) SEMICONDUCTOR DEVICE COMPRISING A THROUGH ELECTRODE AND A PAD CONNECTED TO THE THROUGH ELECTRODE AND HAVING AN EXPOSED PORTION AND METHOD FOR FABRICATING THE SAME

(75) Inventors: In Young Lee, Yongin-si (KR); Donghyeon Jang, Suwon-si (KR); Namseog Kim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 186 days.

(21) Appl. No.: 12/728,683

(22) Filed: Mar. 22, 2010

(65) Prior Publication Data

US 2010/0252935 A1    Oct. 7, 2010

(30) Foreign Application Priority Data

Apr. 3, 2009  (KR) .................. 10-2009-0029043

(51) Int. Cl.
*H01L 23/538* (2006.01)
*H01L 25/065* (2006.01)
*H01L 23/48* (2006.01)

(52) U.S. Cl. ......... 257/774; 257/E23.011; 257/E23.174; 257/E23.169; 257/E23.145; 257/E23.179; 257/E23.176; 257/E23.141; 257/777; 257/723; 257/686; 257/685; 257/690; 257/734; 257/737

(58) Field of Classification Search .............. 257/773, 257/777, 723, 686, 685, E21.522, E23.011, 257/E21.577, 690, E23.174, E25.013, E23.169, 257/737, 738, 734, 666, E25.027, E23.145, 257/E21.585, 620, E23.179, 698, 692, E23.176, 257/E23.141
See application file for complete search history.

(56) References Cited

U.S. PATENT DOCUMENTS

| | | | | |
|---|---|---|---|---|
| 6,852,137 | B2 * | 2/2005 | Miki et al. | 29/25.03 |
| 7,276,799 | B2 * | 10/2007 | Lee et al. | 257/777 |
| 7,537,959 | B2 * | 5/2009 | Lee et al. | 438/106 |
| 7,598,607 | B2 * | 10/2009 | Chung et al. | 257/686 |
| 7,616,167 | B2 * | 11/2009 | Anzai | 343/787 |
| 7,745,931 | B2 * | 6/2010 | Takao | 257/734 |
| 7,777,345 | B2 * | 8/2010 | Lee et al. | 257/774 |
| 7,847,416 | B2 * | 12/2010 | Chung et al. | 257/777 |
| 7,897,511 | B2 * | 3/2011 | Lee et al. | 438/672 |
| 2005/0277288 | A1 | 12/2005 | Ozguz et al. | |

(Continued)

FOREIGN PATENT DOCUMENTS

JP    2005-093980    4/2005

(Continued)

*Primary Examiner* — A O Williams
(74) *Attorney, Agent, or Firm* — F. Chau & Associates, LLC

(57) ABSTRACT

A semiconductor device and a method for fabricating the same, wherein a portion of a substrate comprising a pad is removed to form a via hole. An insulating layer is formed on the substrate. A portion of the insulating layer is removed to form a plurality of openings exposing portions of the pad. A through electrode is formed to fill the via hole and to be electrically connected to the pad through one of the plurality of openings. A portion of the pad is exposed by another opening among the plurality of openings.

11 Claims, 37 Drawing Sheets

U.S. PATENT DOCUMENTS

| | | |
|---|---|---|
| 2006/0087042 A1 | 4/2006 | Kameyama et al. |
| 2006/0214302 A1* | 9/2006 | Matsuo ......................... 257/758 |
| 2008/0230912 A1 | 9/2008 | Lee et al. |
| 2008/0230923 A1* | 9/2008 | Jo et al. ......................... 257/777 |
| 2009/0085224 A1* | 4/2009 | Choi et al. .................... 257/777 |
| 2009/0309231 A1* | 12/2009 | Machida ....................... 257/773 |
| 2010/0090338 A1* | 4/2010 | Lee et al. ...................... 257/737 |
| 2010/0164086 A1* | 7/2010 | Noma et al. .................. 257/686 |

FOREIGN PATENT DOCUMENTS

| | | |
|---|---|---|
| JP | 2006-128353 | 5/2006 |
| KR | 1020060049323 | 5/2006 |
| KR | 100843240 | 6/2008 |

\* cited by examiner

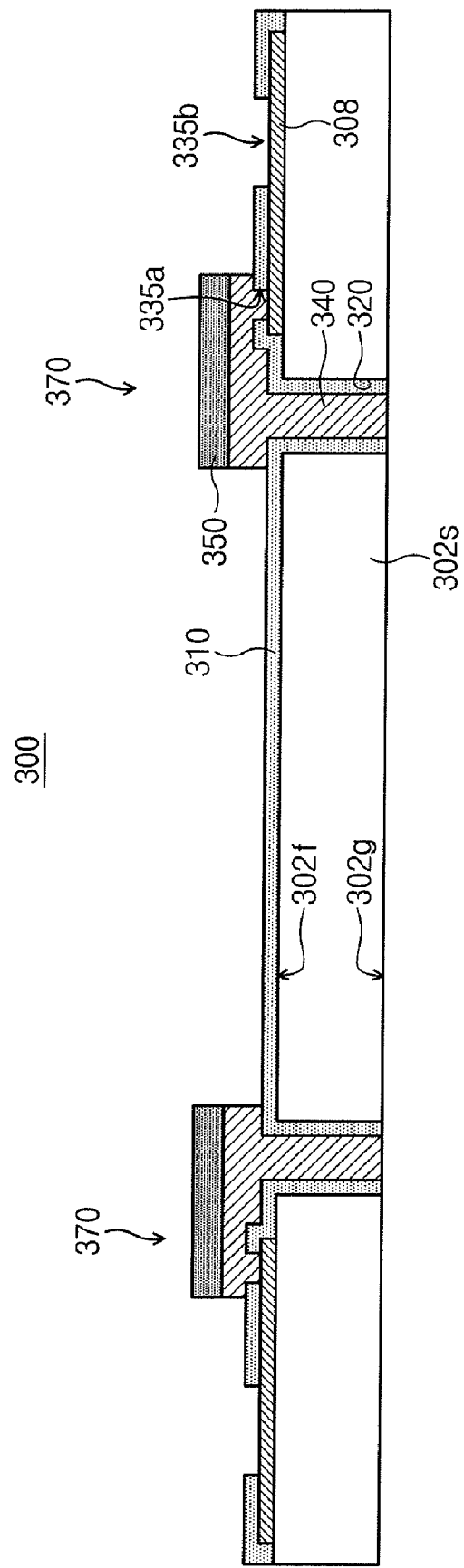

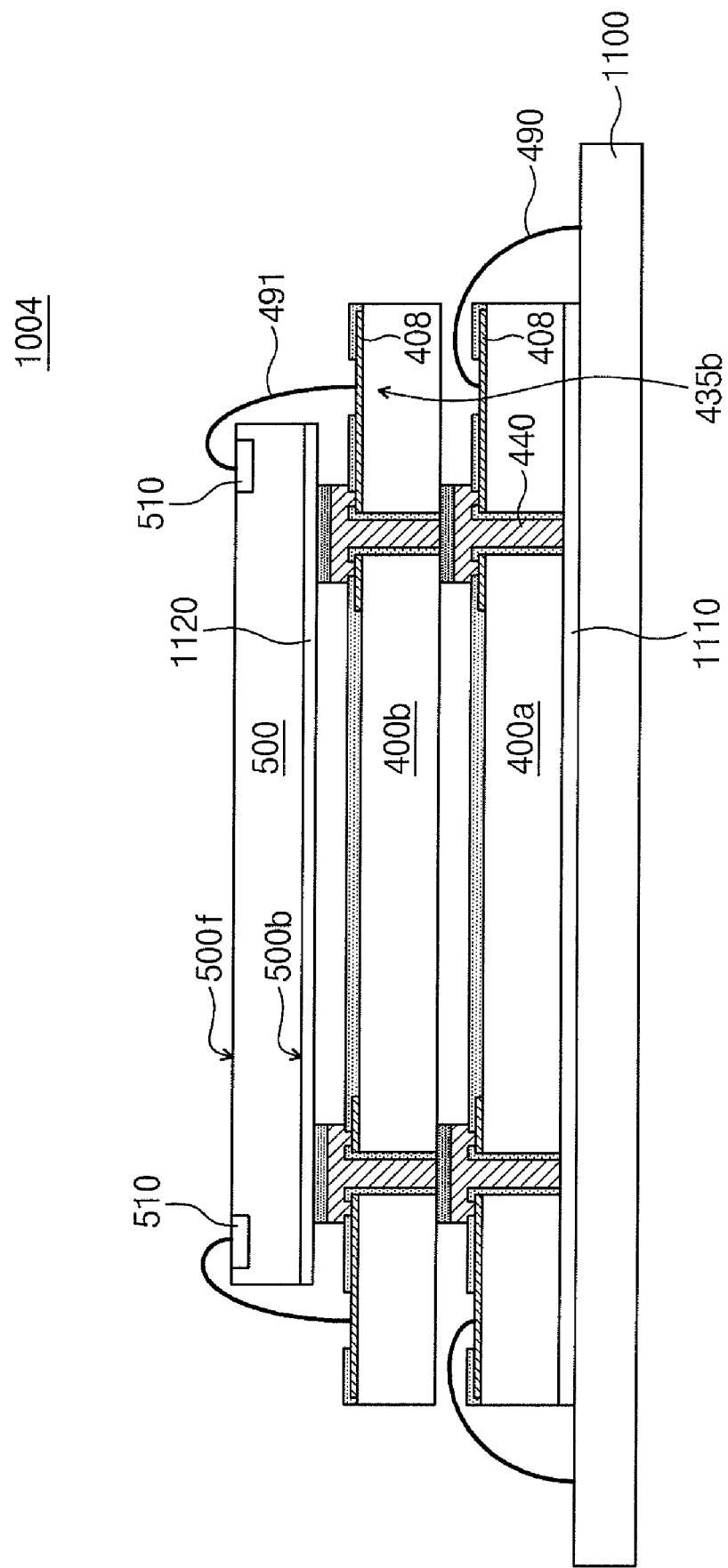

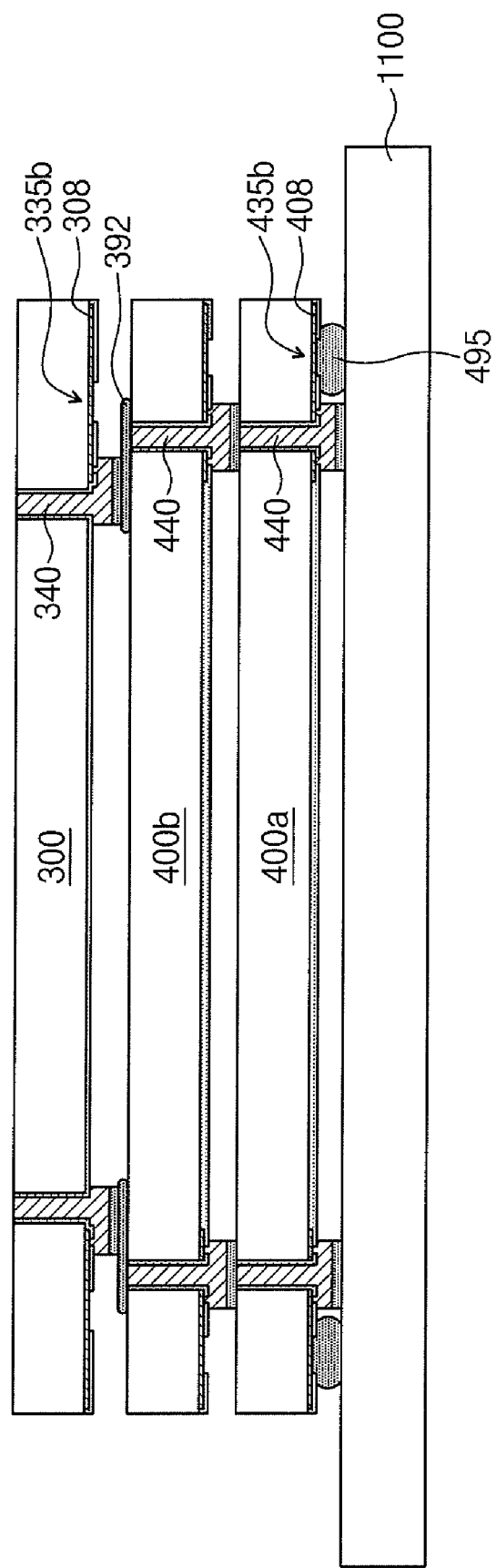

SEMICONDUCTOR DEVICE COMPRISING A THROUGH ELECTRODE AND A PAD CONNECTED TO THE THROUGH ELECTRODE AND HAVING AN EXPOSED PORTION AND METHOD FOR FABRICATING THE SAME

CROSS-REFERENCE TO RELATED APPLICATIONS

This U.S. non-provisional patent application claims priority under 35 U.S.C. §119 of Korean Patent Application No. 10-2009-0029043, filed on Apr. 3, 2009, the entire contents of which are hereby incorporated by reference.

BACKGROUND

The present disclosure herein relates to a semiconductor, and more particularly, to a semiconductor device including a through electrode and a method for fabricating the same.

The development direction of semiconductor packages is changing in response to the current trend toward the reduction in size and weight, and the increase in speed and capacity of electronic products. Integrating a plurality of semiconductor chips into a single semiconductor device by stacking the semiconductor chips is one way in which these goals are being accomplished.

Stacked semiconductor packaging technology is an ideal way to provide these improvements because it can allow for a significant reduction in the area occupied by the semiconductor package, while increasing the memory of a device and permitting multiple functions to be performed within the semiconductor package, such as in a System In Package (SIP).

Conventional stacking methods, for instance, may change an upper structure of the semiconductor chip, such as by performing a separate re-interconnection process, or may form a through electrode on the chip. The method of forming a through electrode provides several advantages, however, including high-performance, high integration density, and a lower profile of the semiconductor product.

SUMMARY

The present disclosure provides a semiconductor device including a through electrode and a method for fabricating the same.

The present disclosure also provides a semiconductor device and a method for fabricating the same, which can inhibit an increase in the process cost according to formation of a through electrode.

The present disclosure also provides a semiconductor device and a method for fabricating the same, which can use a pad for various purposes by forming an opening exposing the pad to allow a probe of test equipment and a solder ball or a bonding wire to contact the pad through the opening.

The present disclosure also provides a semiconductor device and a method for fabricating the same, which can simplify a process by forming a solder in self-alignment with a through electrode without a separate photolithography process.

The present disclosure also provides a semiconductor device and a method for fabricating the same, which can omit a process for forming a via hole insulating layer by performing a passivation process after the through electrode via hole process.

Some embodiments of the inventive concept may provide methods for fabricating a semiconductor device, the method including: removing a portion of a substrate including a pad to form a via hole; forming an insulating layer on the substrate; removing a portion of the insulating layer to form an opening part including a plurality of openings exposing portions of the pad; forming a through electrode at least partially filling the via hole and electrically connected to the pad through one of the plurality of openings; and exposing a portion of the pad through another opening among the plurality of openings.

In some embodiments, the forming of the insulating layer may include forming a passivation layer on the substrate to cover an inner surface of the via hole and the pad after the via hole is formed.

In other embodiments, the forming of the insulating layer may include: forming a passivation layer on the substrate to cover the pad before the via hole is formed; and forming a via hole insulating layer on the substrate to cover an inner surface of the via hole and the passivation layer.

In still other embodiments, the forming of the opening part may include: exposing a first portion of the pad to form a first opening that connects the through electrode to the first portion of the pad; and forming a second opening that exposes a second portion of the pad.

In other embodiments, the method may further include connecting a probe to the second portion of the pad exposed by the second opening to perform an electrical test. The method may further include connecting a connection terminal to the second portion of the pad exposed by the second opening.

In yet other embodiments, the forming of the through electrode may include: forming a mask on the substrate to expose the via hole and the first opening; and plating a conductive material filling the via hole through an electroplating using the mask and connected to the first portion of the pad exposed by the first opening.

In further embodiments, the method may further include forming a solder on the through electrode using the mask, the solder being self-alignment with the through electrode.

In still further embodiments, the forming of the via hole may include: providing a substrate including a first region in which the pad is not formed and a second region in which the pad is formed; and removing a portion of the first region of the substrate.

In further embodiments, the forming of the via hole may include: providing a substrate including a first region in which the pad is not formed and a second region in which the pad is formed; and removing a portion of the pad and a portion of the second region of the substrate.

In other embodiments of the inventive concept, semiconductor devices include: a substrate having a front side on which a pad is disposed and a backside opposite to the front side; a via hole penetrating the substrate; a through electrode filing the via hole and having an upper end protruding from the front side and a lower end exposed on the backside; and an insulating layer insulating the through electrode from the substrate, and including an opening part connecting a portion of the pad to the through electrode and exposing another portion of the pad.

In some embodiments, the opening part may include: a first opening exposing a first portion of the pad adjacent to the through electrode and providing a path through which a portion of the through electrode is expanded and connected to the exposed first portion of the pad; and a second opening exposing a second portion of the pad spaced from the through electrode and providing a path through which an external terminal is connected to the second portion of the pad.

In other embodiments, the pad may include: a through electrode pad including the first portion connected to the through electrode; and a bonding pad extending from the through electrode pad and including the second portion connected to the external terminal.

In still other embodiments, the insulating layer may include: a passivation layer covering the pad; and a via hole insulating layer covering the passivation layer and an inner surface of the via hole. Alternatively, the insulating layer may include a passivation layer covering the pad and an inner surface of the via hole.

In even other embodiments, the semiconductor device may further include a solder on the through electrode, the solder being in self-alignment with the through electrode.

In still other embodiments of the inventive concept, semiconductor devices include: a first semiconductor chip including a first through electrode and a first pad connected to the first through electrode and having a portion thereof exposed; and a second semiconductor chip stacked on the first semiconductor chip and including a second through electrode and a second pad connected to the second through electrode and having a portion thereof exposed, wherein the first and second through electrodes are connected to electrically connect the first and second semiconductor chips to each other.

In some embodiments, the semiconductor device may further include a connection terminal that electrically connects the first pad to the second pad.

In other embodiments, the semiconductor device may further include a third semiconductor chip stacked on the second semiconductor chip, wherein the second and third semiconductor chips are electrically connected by al least one of a connection terminal connected to the second pad and the second through electrode.

In still other embodiments, the semiconductor device may further include a printed circuit board on which the first semiconductor chip is disposed, wherein the first semiconductor chip and the printed circuit board are electrically connected by at least one of the first through electrode and a connection terminal connected to the first pad.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 7A through 7I are cross-sectional views illustrating a method for manufacturing a semiconductor device according to a third embodiment of the inventive concept;

FIGS. 11A through 11I are cross-sectional views illustrating a multichip package having semiconductor devices stacked therein according to an exemplary embodiment of the inventive concept;

DETAILED DESCRIPTION OF THE EMBODIMENTS

Figure 1:
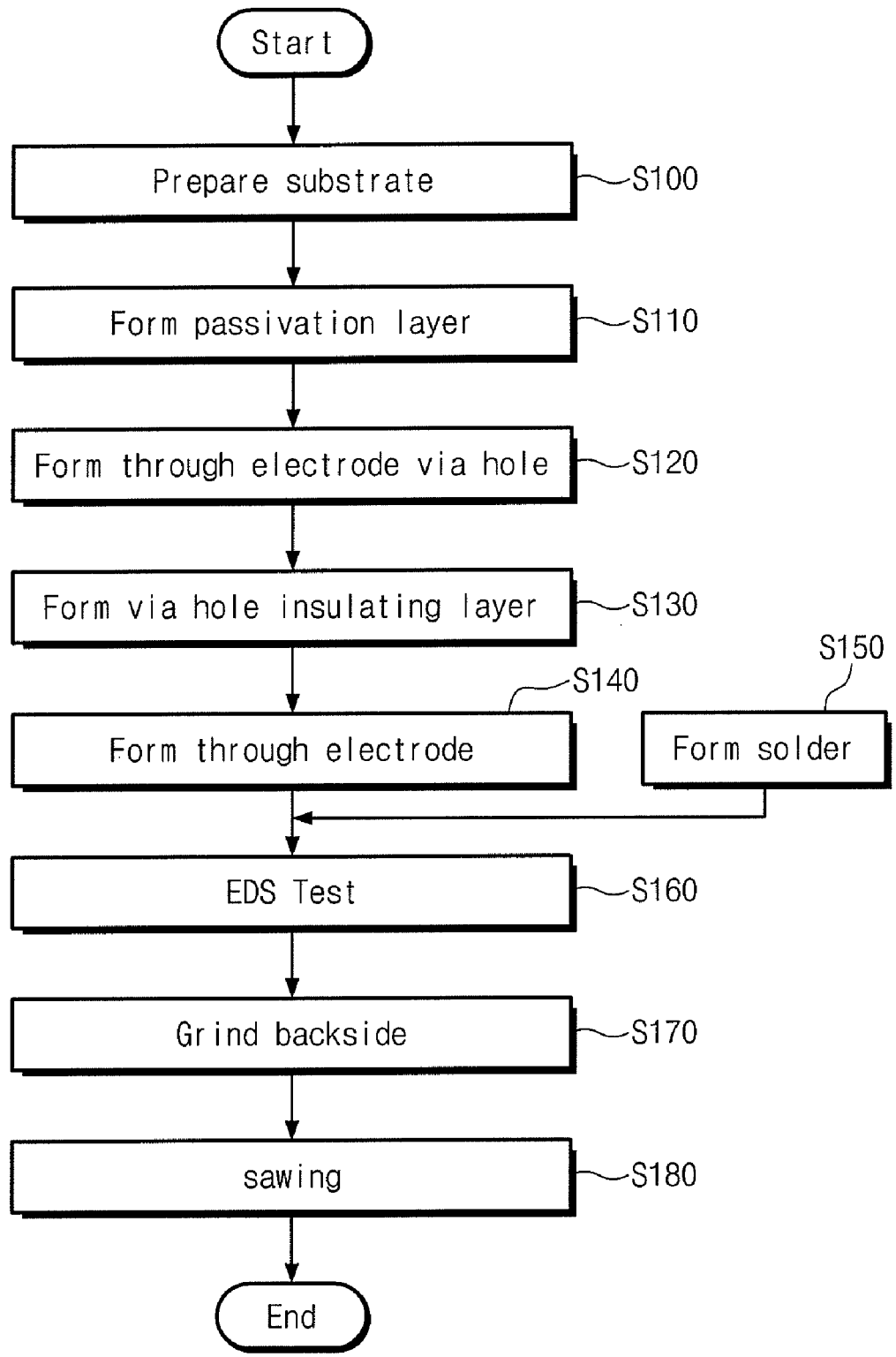
FIG. 1 is a flowchart illustrating a method for fabricating a semiconductor device according to an exemplary embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, exemplary embodiments of the inventive concept will be described in detail with reference to the accompanying drawings.

FIG. 1 is a flowchart illustrating a method for fabricating a semiconductor device according to an exemplary embodiment of the inventive concept.

Referring to FIG. 1, a substrate may be provided in operation S100. The substrate may include an integrated circuit. The substrate may include a semiconductor substrate of a wafer unit. The substrate may include a pad at the front side thereof, which is electrically connected to the integrated circuit.

In operation S110, a passivation layer is formed on the substrate. Then, in operation S120, a through electrode via hole may be formed. The passivation layer to protect the front side of the substrate may be formed of an insulating material. The through electrode via hole may be formed by removing a region in which a pad is formed or a region in which a pad is not formed.

In operation S130, a via hole insulating layer may be formed on the front side of the substrate. The via hole insulating layer may be formed by depositing an insulating material to cover the front side of the substrate and the inner surface of the via hole. The forming of the via hole insulating layer (S130) may include partially removing the via hole insulating layer and the passivation layer to form an opening exposing a portion of the pad. The opening may include a first opening and a second opening. The first opening exposes a portion of the pad to electrically connect the through electrode to the pad. The second opening exposes another portion of the pad to contact the pad with a probe. For example, the opening may be formed by continuously patterning the passivation layer and the via hole insulating layer after the forming of the via hole insulating layer. As another example, the opening may be formed by patterning the passivation layer after the forming of the passivation layer and patterning the via hole insulating layer after the forming of the via hole insulating layer.

In operation S140, a conductive material may be filled in the via hole to form a through electrode. The filling of the via hole (S140) may include a metal deposition process or an electrical plating process of using a seed formed on the inner surface of the via hole through a photolithography. The through electrode may be electrically connected to the pad through the first opening.

Alternatively, in operation S150, the method may further include forming a solder on an upper end of the through electrode exposed outwardly from the front side of the substrate. The solder may be formed in self-alignment with the through electrode.

In operation S160, it can be examined whether there is a defect in the semiconductor device through an electric test, for example, an Electric Die Sorting (EDS) test for a semiconductor device of a wafer unit in which a through electrode is formed. The EDS test may use test equipment including a probe card. For example, the probe of the test equipment is contacted with the pad exposed by the second opening to perform the electric test.

In operation S170, the back surface of the substrate is polished. Then, in operation S180, a sawing process may be performed to separate the semiconductor device of the wafer unit into pieces of a chip unit. The grinding of the backside (S170) may expose a lower end of the through electrode. Semiconductor chips are singulated by the sawing process (S180). A plurality of the semiconductor chips fabricated by the above-mentioned processes may be stacked to implement a multichip package.

Hereinafter, a method for fabricating a semiconductor device that can implement an example of the process flow shown in FIG. 1 will be described.

First Embodiment

FIGS. 2A through 2J are cross-sectional views illustrating a method for fabricating a semiconductor device according to a first embodiment of the inventive concept.

Figure 2A:
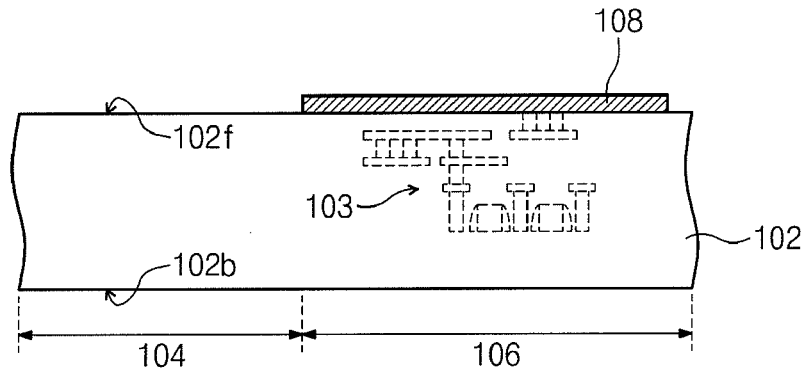
FIGS. 2A through 2J are cross-sectional views illustrating a method for fabricating a semiconductor device according to a first embodiment of the inventive concept.

Referring to FIG. 2A, a substrate 102 may be provided. The substrate 102 may be a semiconductor substrate of a wafer unit. According to an exemplary embodiment of the inventive concept, the substrate 102 may be a silicon wafer. For convenience of explanation, only a portion of the substrate 102 of the wafer unit is shown in the drawings. An integrated circuit 103 may be formed in the substrate 102. The integrated circuit 103 may include a memory circuit, non-memory circuit, or a combination thereof.

The substrate 102 may have a front side 102f that is an active surface and a backside 102b that is an inactive surface. An input/output pad 108 may be formed on the front side of the substrate 102. The input/output pad 108 may be electrically connected to the integrated circuit 103. The pad 108 may formed by depositing a conductive material such as Cu, Al, or alloys thereof.

The substrate 102 may be divided into a first region 104 in which a through electrode is to be formed and a second region 106 in which a pad 108 is formed. The first and second regions 104 and 106 may be regularly or irregularly distributed over substantially the entire region of the substrate 102. The first region 104 may be at a position corresponding to a scribe lane, or may be adjacent thereto.

Figure 2B:
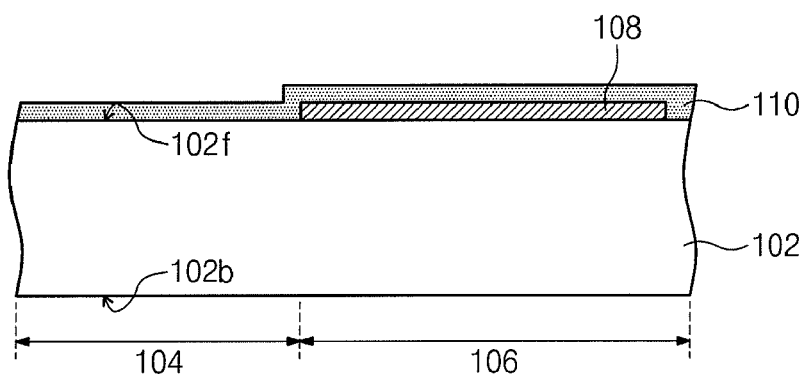

Referring to FIG. 2B, a passivation layer 110 may be formed on the substrate 102. The passivation layer 110 may be formed by depositing one or more insulating materials on the front side 102f of the substrate 102 throughout the first and second regions 104 and 106 to cover the pad 108. Examples of the insulating materials for the passivation layer 110 may include an oxide such as silicon oxide, a nitride such as silicon nitride, a polymer such as parylene, or a combination thereof. As an example, a silicon oxide or a silicon nitride may be deposited conformally through, for example, Chemical Vapor Deposition (CVD) or Atomic Layer Deposition (ALD) to form the passivation layer 110.

Figure 2C:
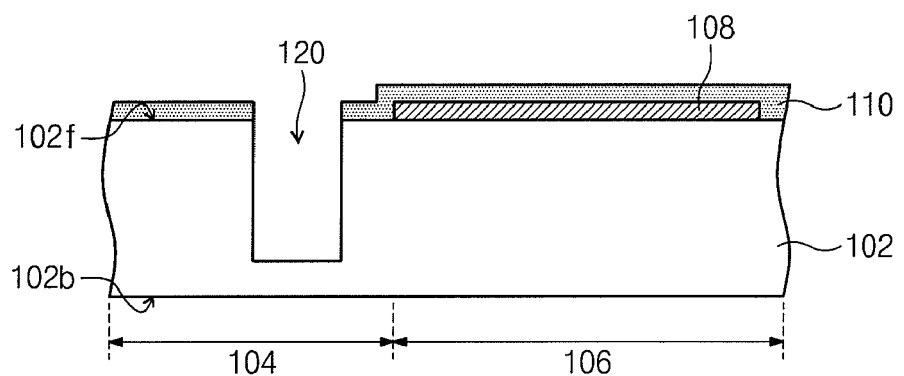

Referring to FIG. 2C, a through electrode via hole 120 may be formed in the substrate 102. A portion of the first region 104 of the substrate 102 may be removed by, for example, dry etching, wet etching, laser-drilling, or mechanical drilling to form the via hole 120. The bottom of the via hole 120 may not reach the backside 102b of the substrate 102, or may be extended to the backside 102b of the substrate 102. According to an exemplary embodiment of the inventive concept, the via hole 120 may be formed by laser-drilling. The laser-drilling does not require a mask or photolithography process of a typical etching process, and may easily regulate the depth or width (diameter) of the via hole 120 by controlling the pulse or strength of a laser. The sidewall of the via hole 120 may be vertical or oblique. The via hole 120 may have a cylindrical shape with lower and upper openings of almost identical size. Otherwise, the via hole 120 may have a tapered shape, the sectional area of which gradually decreases as goes down. When the via hole 120 is extended to the backside 102b, a grinding or etching process for exposing an lower end of the through electrode 140 shown in FIG. 2h may be omitted.

Figure 2D:
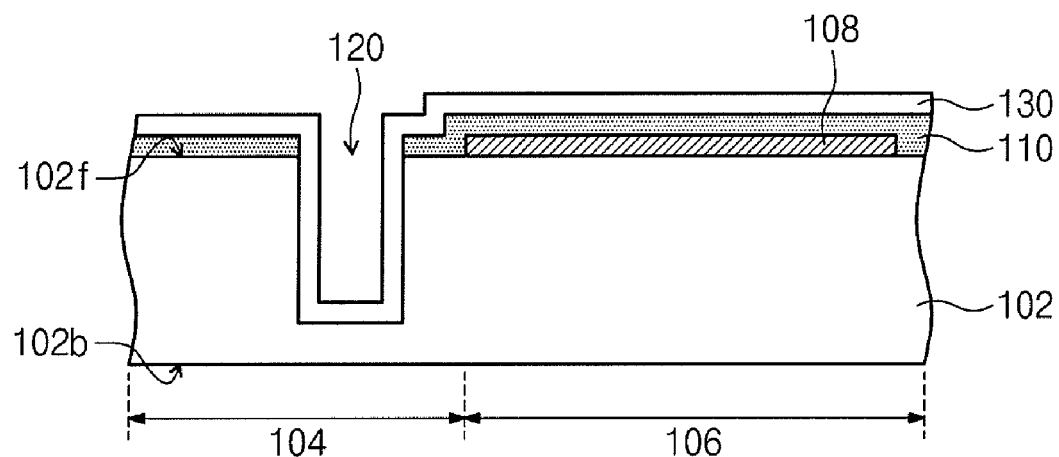

Referring to FIG. 2D, a via hole insulating layer 130 may be formed on the substrate 102. The via hole insulating layer 130 may be formed on the front side of the substrate 102 throughout the first and second regions 104 and 106. The via hole insulating layer 130 may be formed of the same or similar material to that of the passivation layer 110 through a deposition process. For example, a silicon oxide, a silicon nitride, or a combination thereof may be deposited conformally through CVD or ALD to form the via hole insulating layer 130.

The via hole insulating layer 130 may cover the inner surface of the via hole 120 as well as the front side 102f of the substrate 102. The via hole insulating layer 130 may electrically isolate the through electrode (140 of FIG. 2F) from the substrate 102, or inhibit a leakage current. That is, the via hole insulating layer 130 may be provided for electrical insulation between the through electrode (140 of FIG. 2F) and the integrated circuit (103 of FIG. 2A).

Figure 2E:
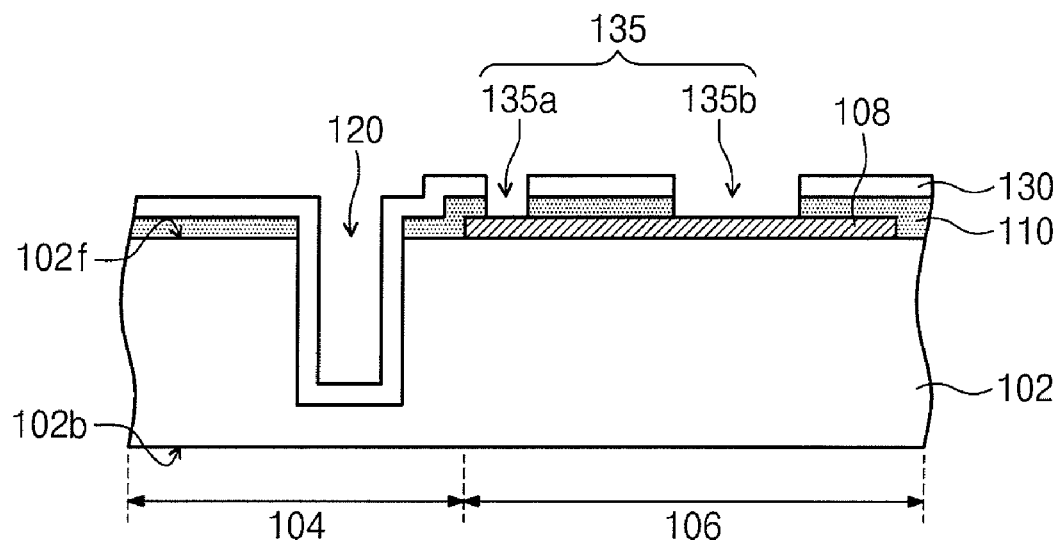

Referring to FIG. 2E, openings 135 may be formed to expose a portion of the pad 108. As an example, the via hole insulating layer 130 and the passivation layer 110 may be patterned to form the openings 135 including a first opening 135a that exposes a portion of the pad 108 and a second opening 135b that exposes another portion of the pad 108 in a single-step process. The first opening 135a may be adjacent to the through electrode (140 of FIG. 2F). For example, the first opening 135a may be formed under the through electrode (140 of FIG. 2F). On the other hand, the second opening 135b may be spaced apart from the through electrode (140 of FIG. 2F).

The pad 108 may serve as a test terminal that contacts a probe (160 of FIG. 2G) of electrical semiconductor test equipment through the second opening 135b. The pad 108 may be electrically connected to the through electrode (140 of FIG. 2F) through the first opening 135a. Also, the pad 108 may serve as a bonding pad and/or a redistribution pad, which will be described with reference to FIGS. 3A through 3C.

The openings 135 may be formed through a single-step patterning process as described above. Differently, the openings 135 may be formed through a two-step patterning process. As an example of the two-step pattern process, after the passivation layer 110 may be formed and patterned, the via hole insulating layer 130 may be formed and patterned to form the openings 135.

Figure 2F:
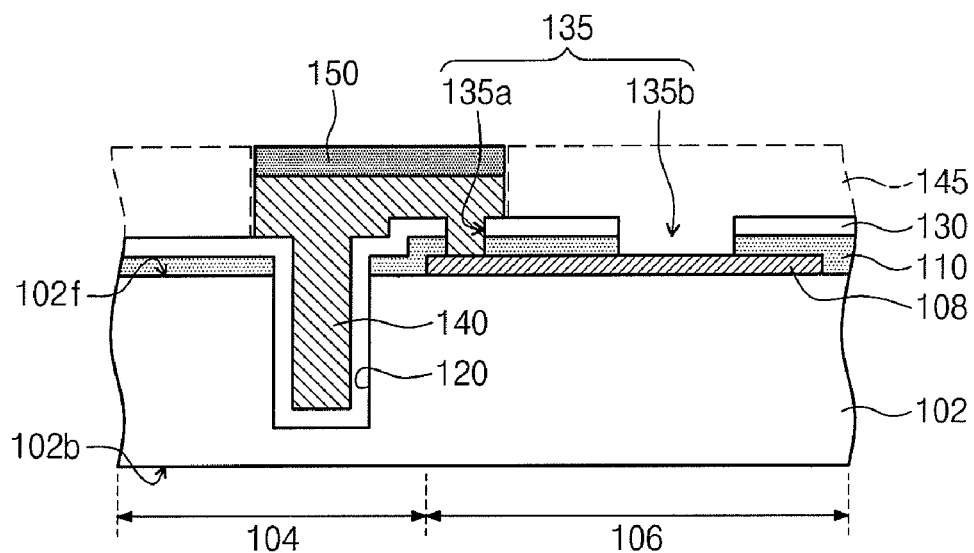

Referring to FIG. 2F, a through electrode 140 may be formed to fill the via hole 120. The through electrode 140 may be electrically connected to the pad 108 through the first opening 135a. The through electrode 140 may protrude outwardly from the front side 102f of the substrate 102 to be used as a connection terminal between a plurality of semiconductor chips in manufacturing of, for example, a multichip package. Conductive materials such as Cu, Al, Ti, Ni, or alloy thereof may be deposited or electroplated to form the through electrode 140.

As an example, after a metal layer is deposited and patterned on the substrate 102 to form a seed, a metal may be filled in the via hole 120 through an electroplating process using the seed to form the through electrode 140. As another example, after a metal layer is deposited on the substrate 102, the metal layer is patterned to form the through electrode 140. As still another example, after a mask 145 shown as a dotted line is formed to open the via hole 120 and the first opening 135a, an electroplating, electroless plating, or deposition process may be performed using the mask 145 to form the through electrode 140. According to an embodiment, after the mask 145 is formed, the electroplating or deposition process may be performed to form the through electrode 140.

A solder 150 may additionally be formed to be electrically connected to the through electrode 140. For example, the solder 150 may be formed on an upper surface of the through electrode 140 protruding outwardly from the front side 102f of the substrate 102. The solder 150 may be formed through a deposition or plating process. If the solder 150 is formed on the through electrode 140, and semiconductor chips are vertically stacked, a process for forming a solder ball or a solder bump may be omitted. The solder 150 may be formed using the mask 145 used in the formation of the through electrode 140, or may be formed through another photolithography process.

According to an embodiment, the mask 145 used to form the through electrode 140 may also be used to form the solder 150. Thus, the through electrode 140 and the solder 150 may be formed self-aligned using the same mask 145. Accordingly, separate photolithography process may be omitted in the formation of the solder 150, thereby reducing steps of the photolithography process. Also, the through electrode 140 and the solder 150 may have substantially the same size (diameter). Even if they have different sizes, a difference therebetween may be insignificant.

If the solder 150 is formed through a separate photolithography process, the solder 150 may have a smaller size than that of the through electrode 140, and thus may have disadvantages in contact reliability or contact resistance. However, since the through electrode 140 and the solder 150 can be formed to have substantially the same size according to this embodiment, the contact reliability can be increased, and the contact resistance can be reduced. Although the solder 150 and the through electrode 140 may have substantially the same size if formed through a separate photolithography process, the number of steps when using the photolithography process is greater than in this embodiment.

Figure 2G:
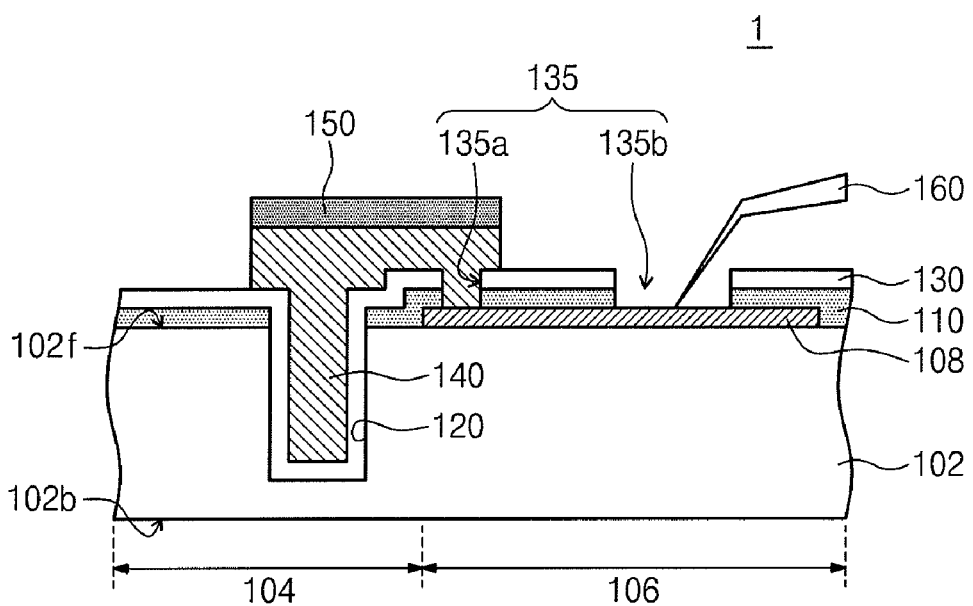

Referring to FIG. 2G, the mask 145 is removed, thereby forming a semiconductor device 1 of a wafer unit. An electrical test (for example, EDS test) may be performed using test equipment such as a prober system to determine whether there is a defect in the semiconductor device 1. For example, a probe 160 of EDS test equipment contacts the pad 108 exposed through the second opening 135b to determine if the semiconductor device 1 operates properly. If the test result on the semiconductor device 1 is determined to be good, a grinding process described below may be performed on the backside 102b of the substrate 102.

Figure 2H:
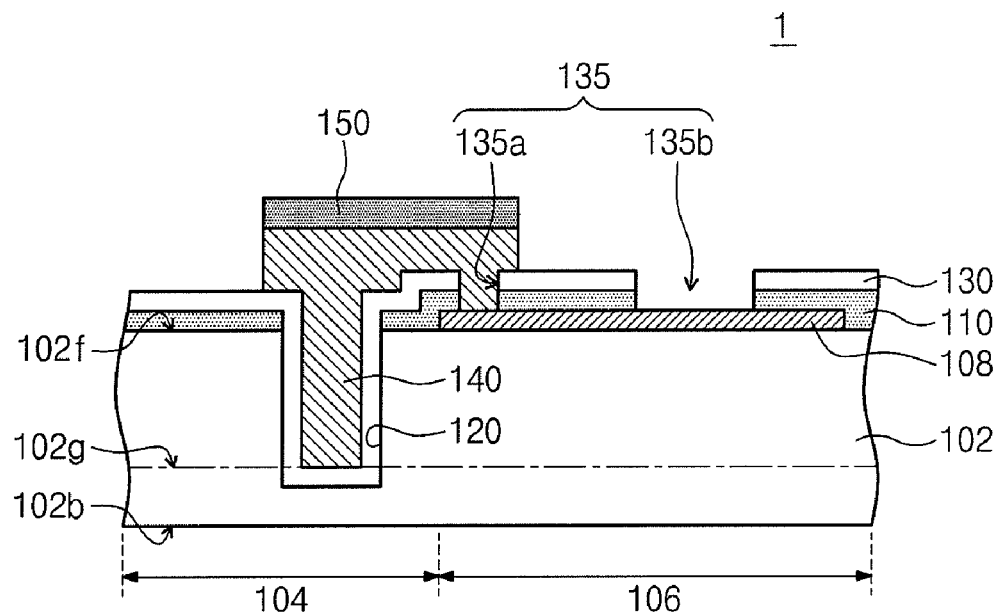

Referring to FIG. 2H, a grinding process may be performed on the backside 102b of the substrate 102. That is, the backside 102b of the substrate 102 may be abraded or mechanically polished. As an example, the backside grinding process may be performed up to a second backside 102g to expose at least a lower end of the through electrode 140. During backside grinding process, a portion of the via hole insulating layer 130 formed under the through electrode 140 may be grinded together. Alternatively, the lower end of the through electrode 140 may be exposed through an etching process on the backside 102b of the substrate 102. As another example, the lower end of the through electrode 140 may be protruded from the second backside 102g. The through electrode 140 may have a substantially cylindrical shape, or may have a tapered shape, the cross-sectional area of which gradually decreases towards the bottom thereof.

Figure 2I:
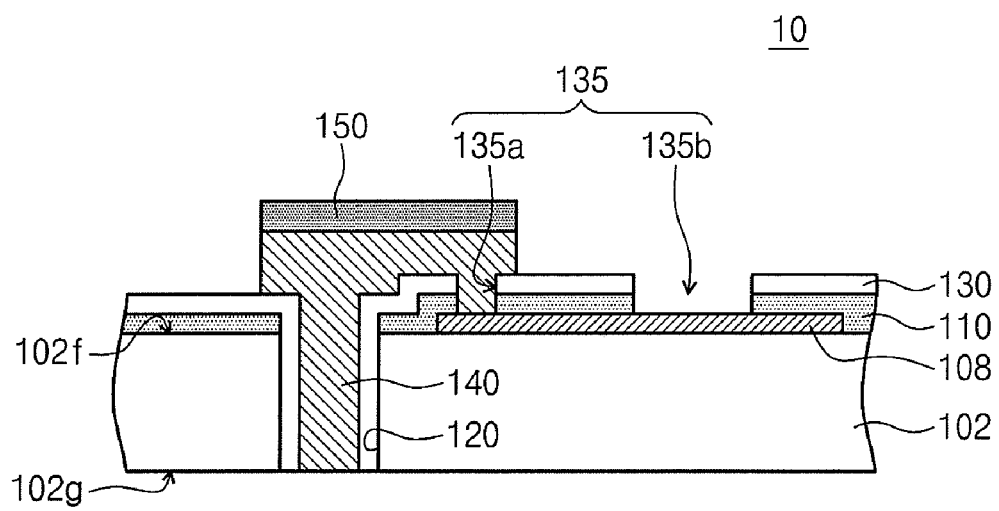

Referring to FIG. 2I, a semiconductor device 10 of a wafer unit including the through electrode 140 vertically penetrating the substrate 102 can be formed through the backside grinding process. Then, the semiconductor device 10 of the wafer unit may be separated through a sawing process.

Figure 2J:
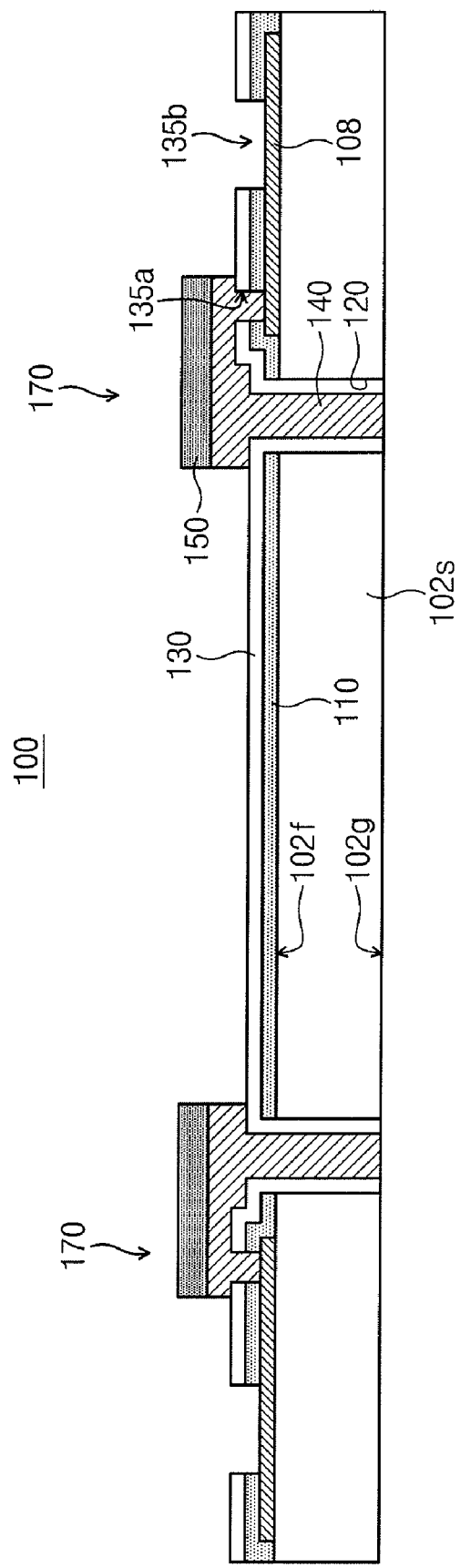

Referring to FIG. 2J, a semiconductor chip 100 including the through electrode 140 vertically penetrating a substrate 102s may be separated or singulated using a dicing process. The semiconductor chip 100 may include an electrical connection 170 including the through electrode 140 and the pad 108. The electrical connection 170 may serve as an external contact terminal that electrically connects the semiconductor chip 100 to another semiconductor chip. The pad 108 may be disposed close to the edge of the semiconductor chip 100, and the through electrode 140 may be disposed close to the center of the semiconductor chip 100, or vice versa. The electrical connection 170 may be disposed adjacent to the edge of the semiconductor chip 100, or may be regularly or irregularly disposed throughout the semiconductor chip 100.

Figure 3A:
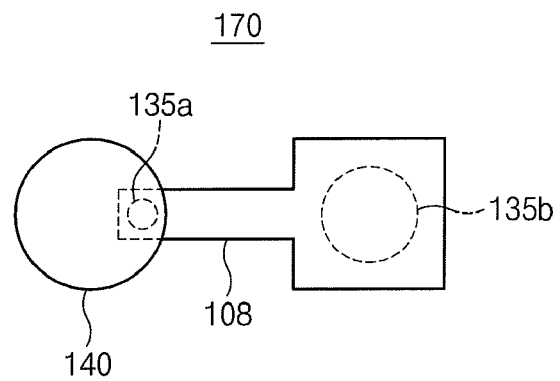
FIG. 3A is a plan view illustrating an electrical connection shown in FIG. 2J.
Figure 3B:
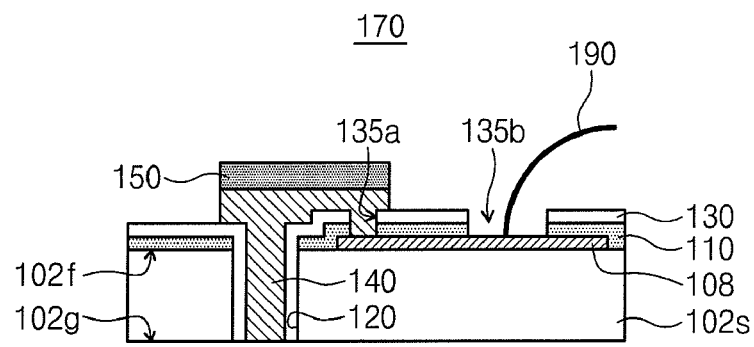
FIGS. 3B and 3C are cross-sectional views illustrating an electrical connection shown in FIG. 2J.
Figure 3C:
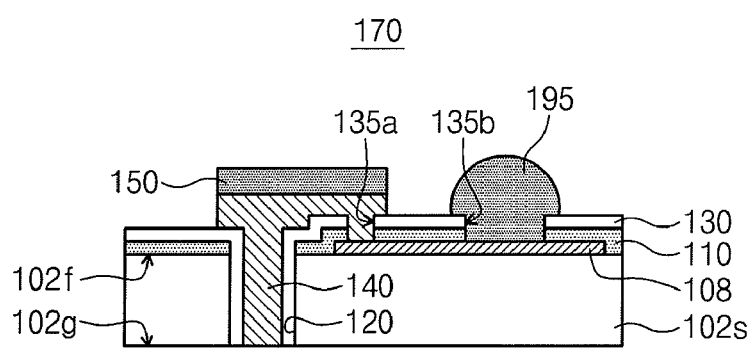

FIGS. 3A through 3C are diagrams illustrating a portion of FIG. 2J. FIG. 3A is a plan view illustrating an electrical connection shown in FIG. 2J. FIGS. 3B and 3C are cross-sectional views illustrating the electrical connection.

Referring to FIGS. 3A through 3C, the electrical connection 170 may be configured to electrically connect the through electrode 140 and the pad 108 to each other through the first opening 135a. The pad 108, as described with reference to FIG. 2G, may be contacted by the probe 160 through the second opening 135b. Also, the pad 108, as shown in FIG. 3B, may be electrically connected to a bonding wire 190 through the second opening 135b, or, as shown in FIG. 3C, may be electrically connected to a solder bump or a solder ball 195. That is, the pad 108 may serve as a test pad during the fabrication process of the semiconductor chip 100, and may serve as a bonding pad after the completion of the semiconductor chip 100. The first and second openings 135a and 135b, as shown in FIG. 3A, may have various shapes such as circular, oval, or rectangular shapes.

The pad 108 may serve as a redistribution pad. For example, if the semiconductor chip 100 and other semiconductor chips having different types and sizes from the semiconductor chip 100 are vertically stacked to form a multichip package; the through electrode 140 of the semiconductor chip 100 may be difficult to be connected to through electrodes of other semiconductor chips. In this case, the solder ball 195 or the bonding wire 190 may be used to contact the pad 108 through the second opening 135b to overcome the difficulty in electrical connection.

Second Embodiment

FIGS. 4A through 4J are cross-sectional views for illustrating a method for fabricating a semiconductor device according to a second embodiment of the inventive concept. Since the second embodiment are identical or similar to the first embodiment, identical parts will be briefly described or omitted, and different parts will be fully described below.

Figure 4A:
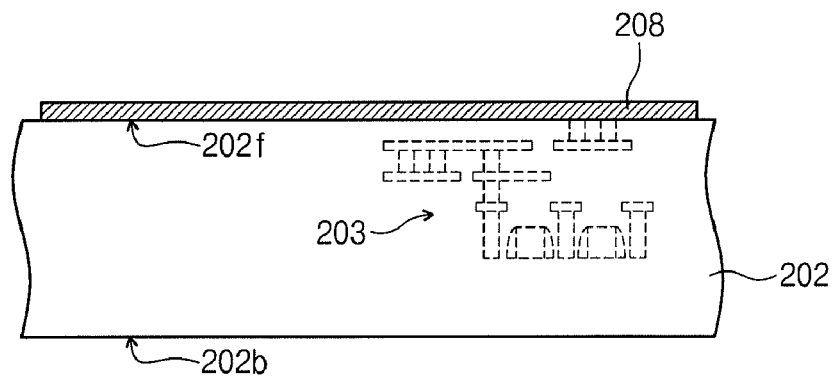
FIGS. 4A through 4J are cross-sectional views illustrating a method for fabricating a semiconductor device according to a second embodiment of the inventive concept.

Referring to FIG. 4A, a semiconductor substrate 202 of a wafer having a front side 202f and a backside 202b and including an integrated circuit 203 may be provided. A pad 208 of a conductive material may be formed on the front side 202f to be electrically connected to the integrated circuit 203. A plurality of the pad 208 may be formed on the front side 202f of the substrate 202. The pad 208 of FIG. 4A may have the same size as the pad 108 of FIG. 2A, or may have a different size from the pad 108 of FIG. 2A. Although the pad 208 of FIG. 4A is shown to be greater than the pad 108 of FIG. 2A, it should be appreciated that they are merely illustrated in different scales for the sake of convenience. The pads 108 and 208 may have the same size, and may be at the same position, an example of which is shown in FIG. 11G. In FIG. 11G, the pad 308 corresponds to the pad 108 of FIG. 2A, and the pad 408 corresponds to the pad 208 of FIG. 4A.

Figure 4B:
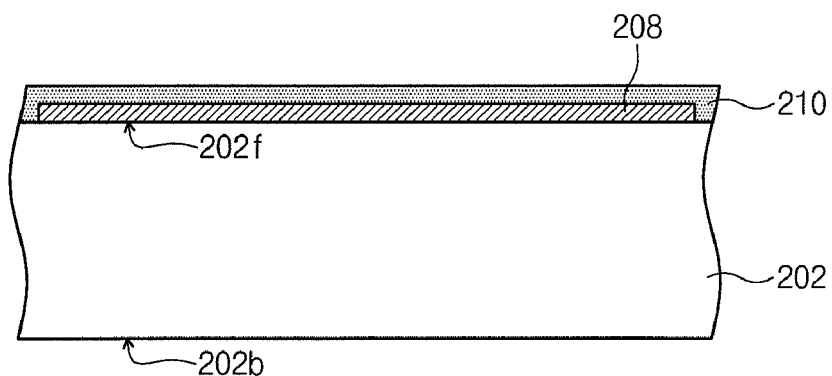

Referring to FIG. 4B, a passivation layer 210 may be formed on the front side 202f of the substrate 202 to cover the pad 208. The passivation layer 210 may be formed of an insulating material such as an oxide, a nitride, a polymer, or a combination thereof through Physical Vapor Deposition (PVD) or Chemical Vapor Deposition (CVD).

Figure 4C:
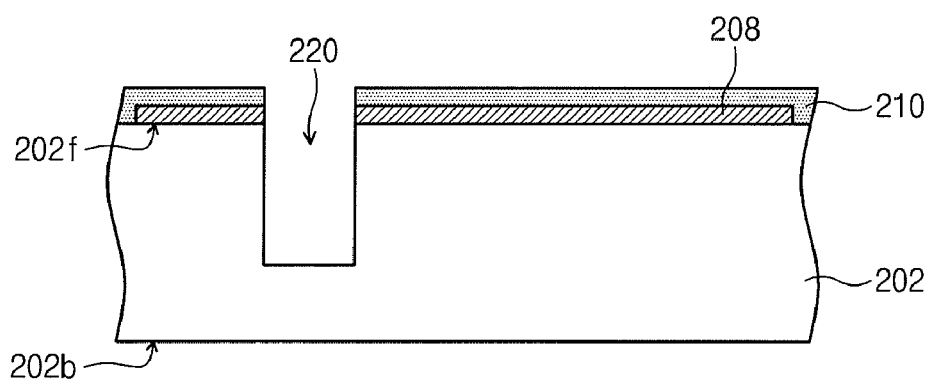

Referring to FIG. 4C, a portion of the substrate 202 may be removed to form a through electrode via hole 220. The forming of the via hole 220 may be performed through, for example, a laser drilling process. Differently from the first embodiment, the via hole 220 is formed through the pad 208. In the first embodiment, a through electrode is formed in a scribe lane or a region adjacent thereto. In this case, the size of the scribe lane should be big enough to accommodate the through electrode. If the size of the scribe lane is reduced to increase the number of semiconductor chips for each wafer, there may be a difficulty in forming the through electrode in the scribe lane. Particularly, if a pad is positioned around the center of the semiconductor chip, it may be very difficult to form the through electrode in the scribe lane. To solve this problem, a direct type through electrode may be formed through the pad in a region of the substrate in which the pad is formed. In an embodiment, the via hole 220 may be formed to penetrate the pad 208 for forming the direct-type through electrode (240 of FIG. 4F). The via hole 220 penetrating the pad 208 may not reach the backside 202b of the substrate 202, or may reach the backside 202b of the substrate 202. If the via hole 220 extends to the backside 202b, a grinding or etching process for exposing a lower end of the through electrode (240 of FIG. 4H) may be omitted.

Figure 4D:
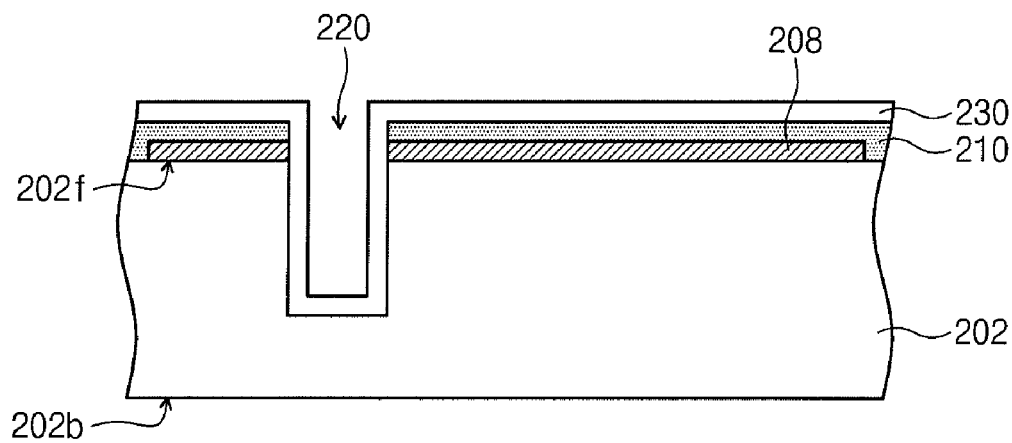

Referring to FIG. 4D, a via-hole insulating layer 230 may be formed on the front side 202f of the substrate 202. The via-hole insulating layer 230 may cover the passivation layer 210 and the inner surface of the via hole 220. The via hole insulating layer 230 may be formed of the same or similar material to that of the passivation layer 210 through a deposition process. For example, a silicon oxide, a silicon nitride, or a combination thereof may be deposited through a deposition process to form the via hole insulating layer 230.

Figure 4E:
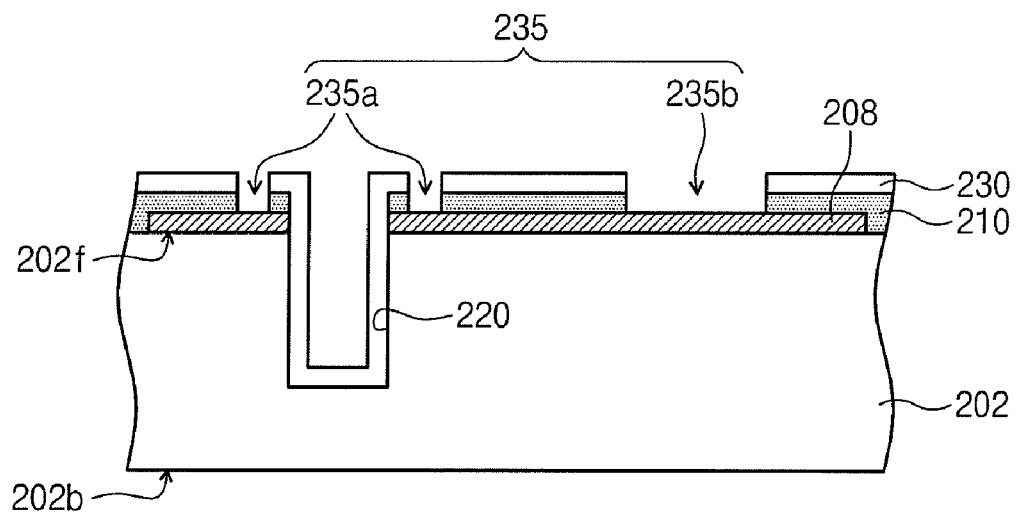

Referring to FIG. 4E, the via hole insulating layer 230 and the passivation layer 210 may be patterned to form openings 235 including first openings 235a exposing portions of the pad 208 and a second opening 235b exposing another portion of the pad 208. As another example, the openings 235 may be formed through a two-step patterning process in which, after the passivation layer 210 is formed and patterned, the via hole insulating layer 230 may be formed and patterned. As still another example, the passivation layer 210 and the via hole insulating layer 230 formed around an upper part of the via hole 220 may be removed during the formation of the opening 235. Accordingly, a portion of the upper surface and the sidewall of the pad 208 may be exposed (not shown). In this case, the through electrode (240 of FIG. 4F) may be formed to directly contact the exposed surface and sidewall of the pad 208.

Figure 4F:
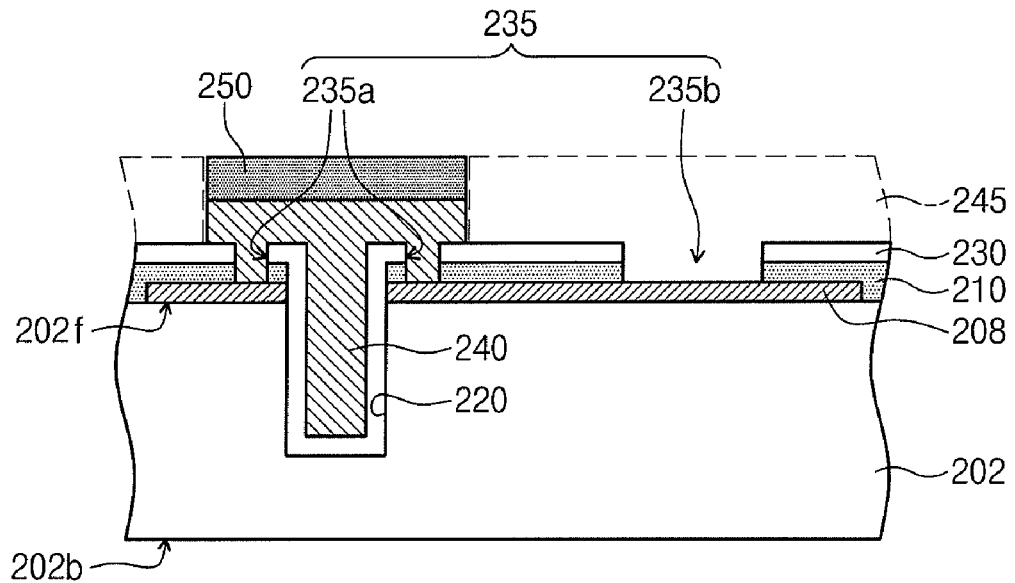
Figure 4G:
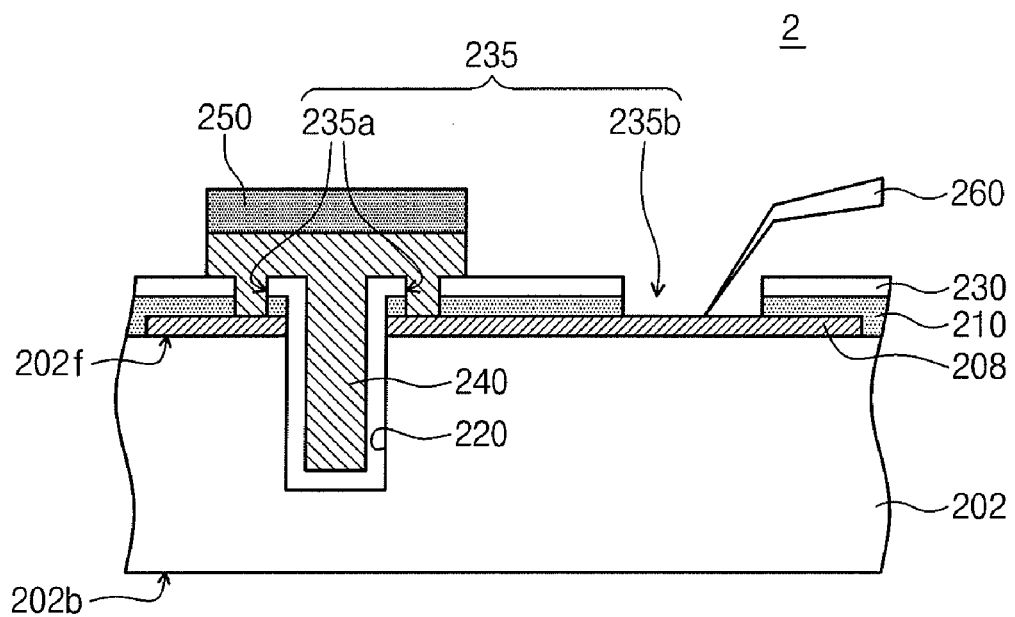
Figure 5A:
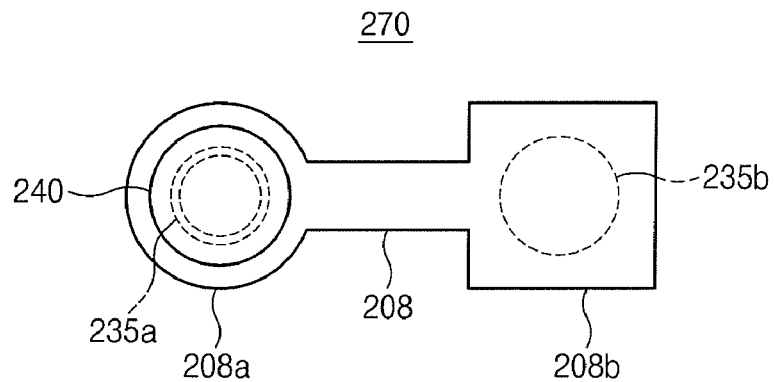
FIG. 5A is a plan view illustrating an electrical connection shown in FIG. 4J.

As shown in FIG. 5A, the first opening 235a may be formed in a ring shape, and the second opening 235b may be formed in a circular shape when viewed in plan view. The second opening 235b may expose the pad 208 such that a probe (260 of FIG. 4G) of electrical test equipment may contact the pad 208. A terminal such as a bonding wire or a solder ball may be connected to the pad 208 exposed by the second opening 235b. The first opening 235a may expose the pad 208 such that the through electrode (240 of FIG. 4F) may contact the pad 208. Thus, the pad 208, as shown in FIG. 5A, may be divided into a bonding pad 208b and a through electrode pad 208a. The pad 208 may also serve as a redistribution pad.

Referring to FIG. 4F, a through electrode 240 is formed to fill the via hole 220. The through electrode 240 may be electrically connected to the pad 208 through the first opening 235a. A metal may be plated through an electroplating process using a mask 245 to form the through electrode 240. A solder 250 may be further formed in self-alignment with the through electrode 240 through the electroplating process using the mask 245.

Referring to FIG. 4G, upon removal of the mask 245, a semiconductor device 2 of a wafer unit is formed. For example, a probe 260 of an EDS test equipment contacts the pad 208 exposed through the second opening 235b to determine whether the semiconductor device 2 operates properly. That is, the pad 208 may serve as a test pad.

Figure 4H:
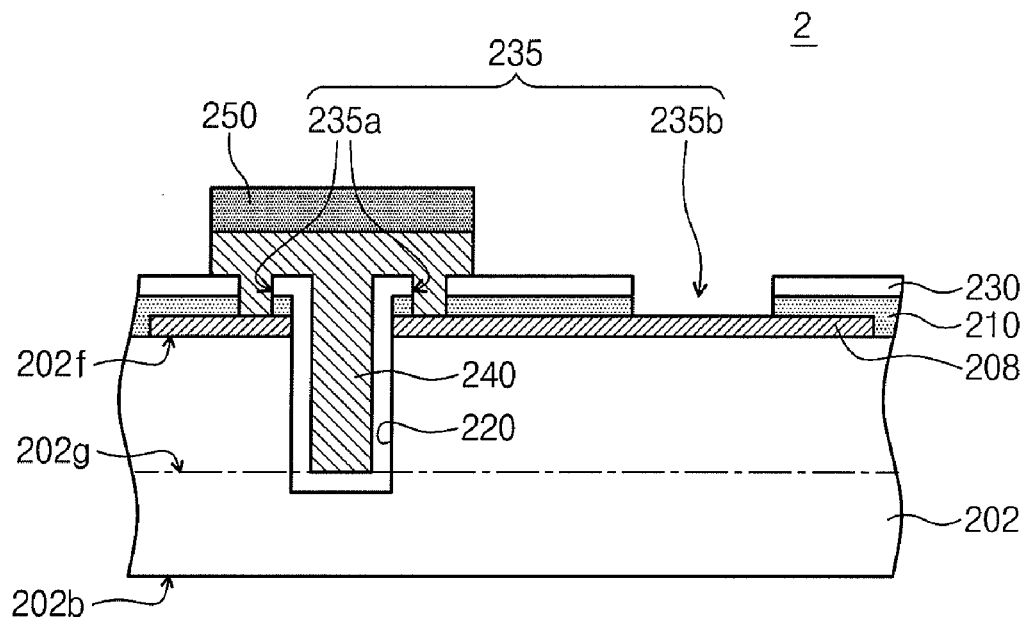

Referring to FIG. 4H, a grinding process may be performed on the backside 102b of the substrate 102. As an example, the backside grinding process may be performed up to a second backside 202g to expose at least a lower end of the through electrode 240. As another example, the lower end of the through electrode 240 may be protruded from the second backside 202g. The through electrode 240 may have a substantially cylindrical shape, or may have a tapered cylindrical shape.

Figure 4I:
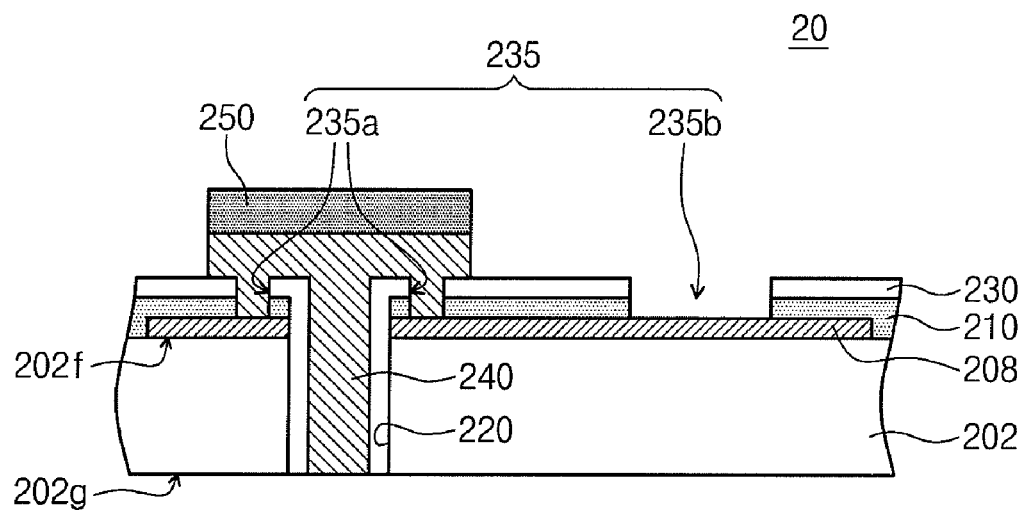

Referring to FIG. 4I, a semiconductor device 20 of a wafer unit including the through electrode 240 vertically penetrating the substrate 202 can be implemented through the backside grinding process. Then, the semiconductor device 20 of the wafer unit may be separated into pieces of a chip unit through a sawing process.

Figure 4J:
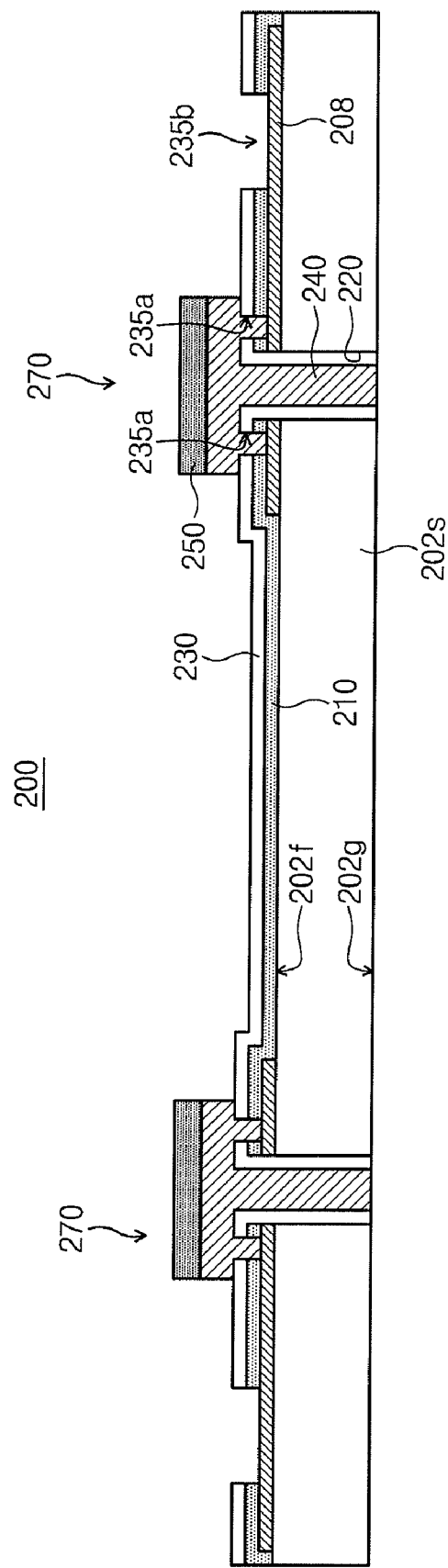

Referring to FIG. 4J, the sawing process may divide the wafer into a plurality of semiconductor chips 200 each having an electrical connection 270 formed in a substrate 202s. The electrical connection 270 may include the through electrode 240 and the pad 208, and may be formed adjacent the edge of the semiconductor chip 200 or substantially throughout the semiconductor chip 200. The through electrode 240 may be disposed close to the center of the semiconductor chip 200, and the pad 208 may be disposed close to the edge of the semiconductor chip 200. Accordingly, the second opening 235b may be formed adjacent to the edge of the semiconductor chip 200. To the contrary, the second opening 235b may be disposed close to the center of the semiconductor chip 200, and the through electrode 240 may be formed adjacent to the edge of the semiconductor chip 200.

Figure 5B:
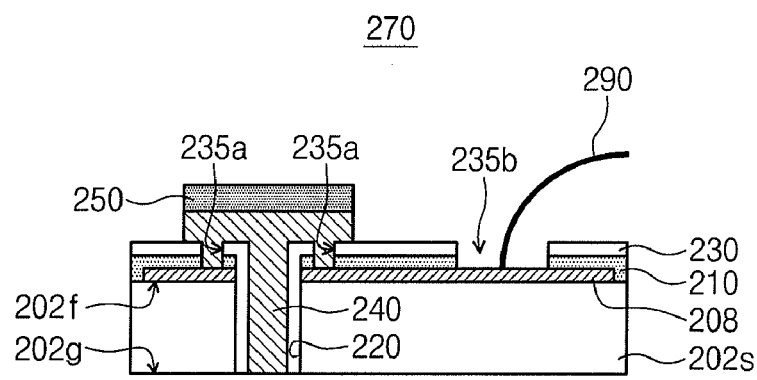
FIGS. 5B and 5C are cross-sectional views illustrating an electrical connection shown in FIG. 4J.
Figure 5C:
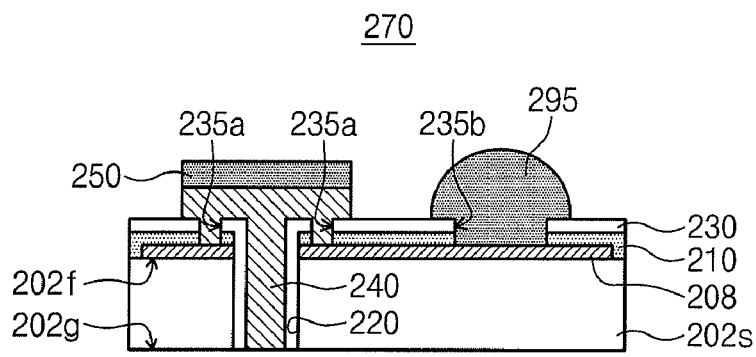

FIGS. 5A through 5C are diagrams illustrating a portion of FIG. 4J. FIG. 5A is a plan view illustrating an electrical connection. FIGS. 5B and 5C are cross-sectional views illustrating the electrical connection.

Referring to FIGS. 5A through 5C, the pad 208, as shown in FIG. 5B, may be electrically connected to a bonding wire 290 through the second opening 135b, or, as shown in FIG. 5C, may be electrically connected to a solder ball 295 or a conductive bump. According to an exemplary embodiment of the inventive concept, the pad 108 may be divided into a bonding pad 208b electrically connected to the bonding wire 290 or the solder ball 295 through the second opening 235b and a through electrode pad 208a electrically connected to the through electrode 240 through the first opening 235a. The pad 208 may also serve as a redistribution pad. For example, to implement a multichip package, upper and lower semiconductor chips may be electrically connected using the solder ball or the boding wire 290 connected to the bonding pad 208.

Another Example of Process Flow

Figure 6:
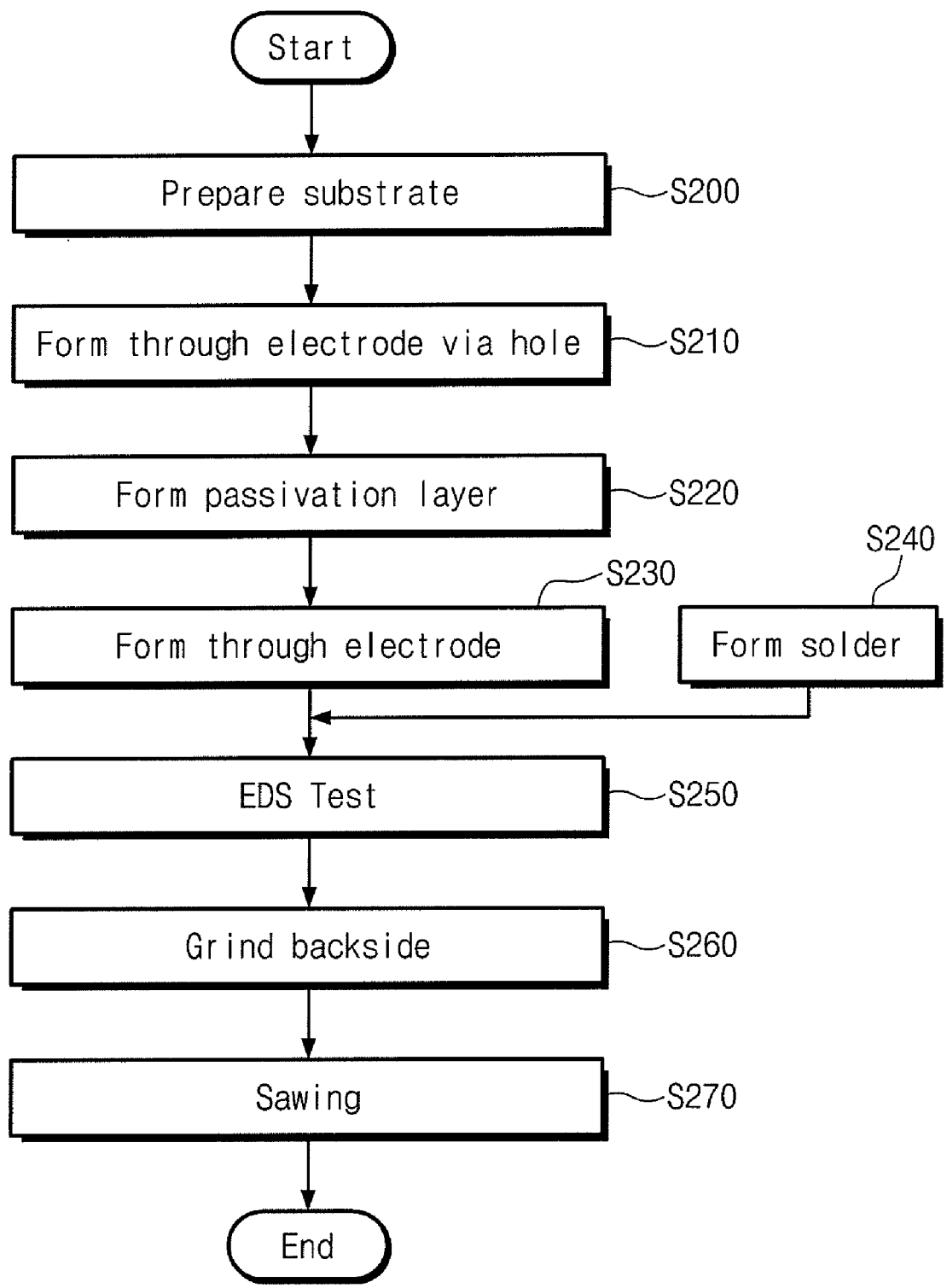
FIG. 6 is a flowchart illustrating a method for fabricating a semiconductor device according to another embodiment of the inventive concept.

FIG. 6 is a flowchart illustrating a method for fabricating a semiconductor device according to another embodiment of the inventive concept.

Referring to FIG. 6, a substrate may be provided in operation S200. The substrate may include a semiconductor substrate of a wafer unit having an integrated circuit. The substrate may include an input/output pad at the front side thereof, which is electrically connected to the integrated circuit.

In operation S210, a through-electrode via hole is formed in the substrate. Then, in operation S220, a passivation layer may be formed over the resulting structure. It has been described in FIG. 1 that the through-electrode via hole may be formed after the passivation layer (S110) is formed. However, in this embodiment, the passivation layer (S220) is formed after the through electrode via hole (S210) is formed. In the exemplary embodiment described in FIG. 1, the via hole insulating layer (S130) should be separately formed for insulation of the via hole. However, in this embodiment, since the passivation layer can perform a function of a via hole insulation layer, the via hole insulating layer may be omitted, and continuity of layer can be ensured. As a result, the overall process can be simplified and manufacturing costs can be reduced.

The forming of the passivation (S220) may include patterning the passivation layer to form openings that expose a portion of the pad. The openings may include a first opening exposing a portion of the pad to electrically connect the through electrode to the pad and a second opening exposing another portion of the pad such that a probe can contact the pad for testing.

In operation S230, a conductive material may be filled in the via hole to form a through electrode. The filling of the via hole (S230) may be formed through a electroplating, electroless plating, or deposition process. The through electrode may be electrically connected to the pad through the first opening.

Alternatively, a solder may be further formed on the through electrode in operation S240. The solder may be formed in self-alignment with the through electrode using the mask used in the forming of the through electrode.

In operation S250, it can be determined whether there is a defect in the semiconductor device through an electric test, for example, an EDS test for a semiconductor device of a wafer unit in which a through electrode is formed. The EDS test may use test equipment including a probe card. As an example, a probe of the test equipment contacts the pad exposed by the second opening to perform the electric test.

In operation S260, a lower end of the through electrode may be exposed through grinding of the backside of the substrate. Then, in operation S270, a sawing process may be performed to separate the semiconductor devices in the wafer unit.

Hereinafter, a method for fabricating a semiconductor device that can implement another example of the process flow shown in FIG. 6 will be described.

Third Embodiment

FIGS. 7A through 7I are cross-sectional views illustrating a method for manufacturing a semiconductor device according to a third embodiment of the inventive concept. Since the third embodiment are identical or similar to the first embodiment, identical parts will be briefly described or omitted, and different parts will be fully described below.

Figure 7A:
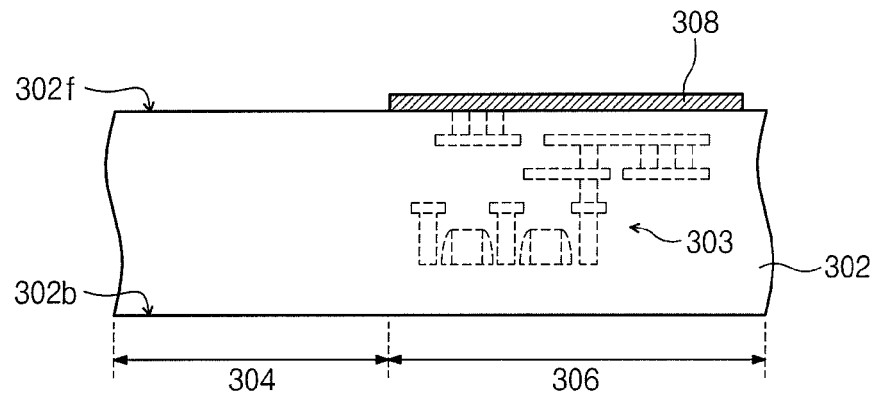

Referring to FIG. 7A, a substrate 302 including an integrated circuit 303 may be provided. The substrate 302 may be a silicon wafer having a front side 302f on which a pad 308 is formed and a backside 302b opposite to the front side 302f. The substrate 302 may include a first region 304 in which a through electrode is formed and a second region 306 in which the pad 308 is formed. The first region 304 may be a region corresponding to a scribe lane or a region adjacent thereto.

Figure 7B:
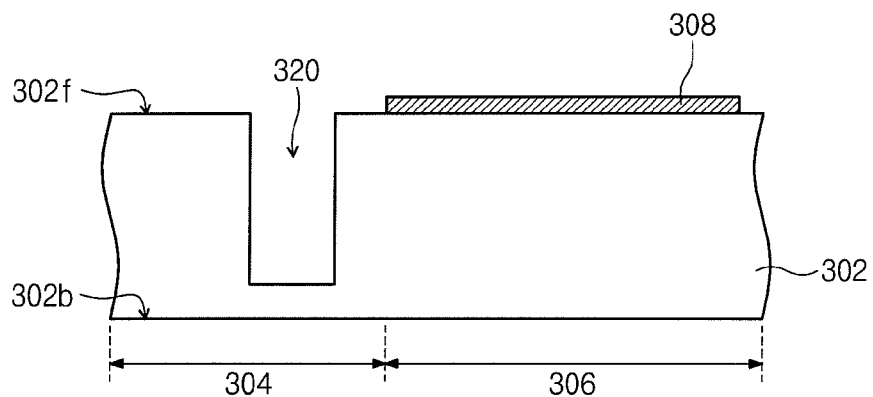

Referring to FIG. 7B, a through-electrode via hole 320 may be formed in the substrate 302. For example, a portion of the first region 304 of the substrate 302 may be removed through, for example, an etching process or a laser-drilling process to form the via hole 320. The via hole 320 may be extended to the backside 302b of the substrate 302, or may not reach the backside 302b of the substrate 302. If the via hole 320 is extended to the backside 302b, a grinding or etching process for exposing an lower end of the through electrode (340 of FIG. 7G) may be omitted.

Figure 7C:
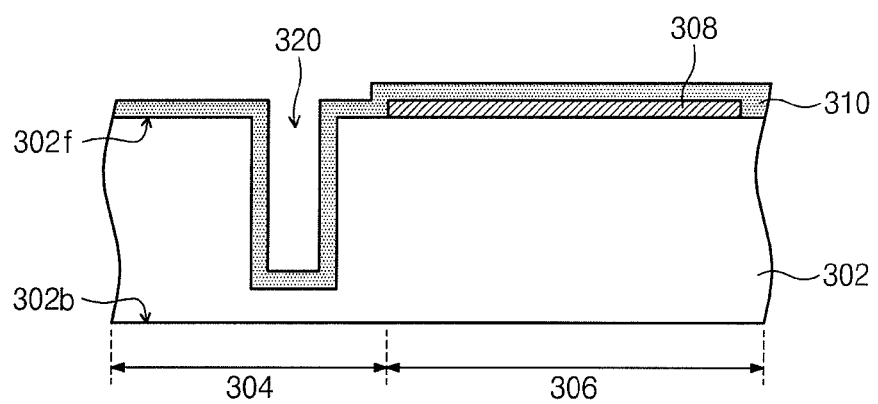

Referring to FIG. 7C, a passivation layer 310 may be formed on the substrate 302. An insulating material is deposited on the front side 302f of the substrate 302 throughout the first and second regions 304 and 306 to form the passivation layer 310, which covers the inner surface of the via hole 320 and the pad 308.

Unlike the first embodiment, the passivation layer 310 may be formed after the through electrode via hole 320 is formed. Thus, the passivation layer 310 may cover the inner surface of the via hole 320 as well as the front side 302f of the substrate 302. Accordingly, a via hole insulating layer (e.g., 130 of FIG. 2D) may not be required. A deposition process of an insulating material, a photolithography process, and an etching process for forming the via hole insulating layer may thus be omitted.

Figure 7D:
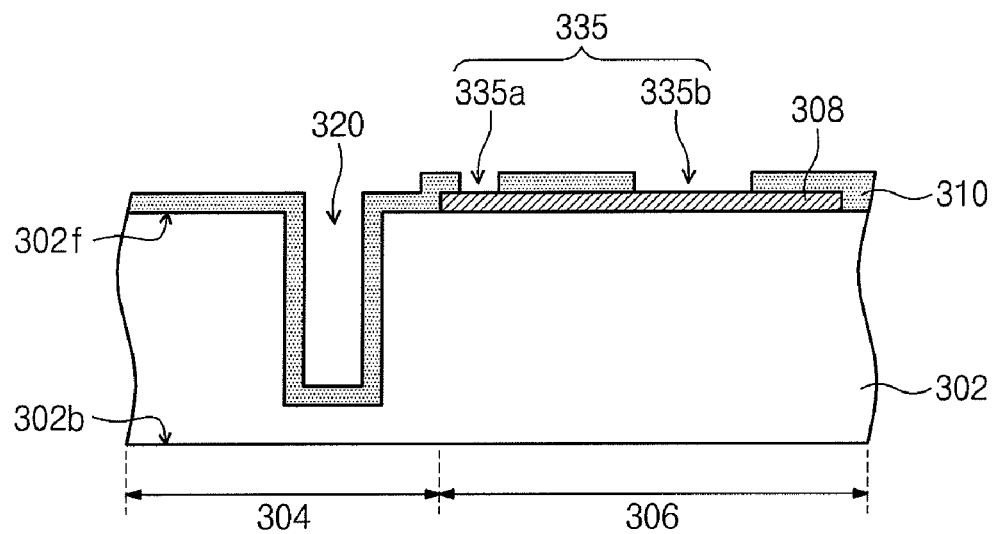

Referring to FIG. 7D, openings 335 may be formed to expose portions of the pad 308. As an example, the openings 335 may include a first opening 335a extending through the passivation layer 310 to expose a portion of the pad 308 and a second opening 335b exposing another portion of the pad 308.

Figure 7E:
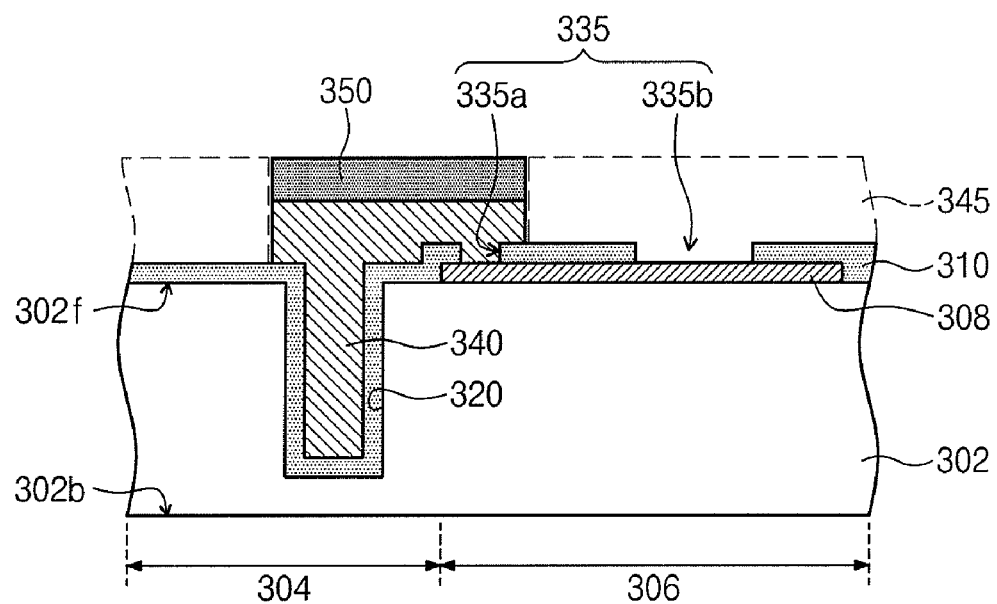

Referring to FIG. 7E, a through electrode 340 may be formed to fill the via hole 320. For example, a mask 345 may be formed on the substrate 345 to expose the via hole 320 and the first opening 335a, and then a metal is plated through an electroplating process using the mask 345 to form the through electrode 340. The through electrode 340 may be electrically connected to the pad 308 through the first opening 335a.

A solder 350 may be further formed to be electrically connected to the through electrode 340. For example, the solder 350 may be formed in self-alignment with the through electrode 340 through a plating process using the mask 345 used in the forming of the through electrode 340 without an additional photolithography process.

Figure 7F:
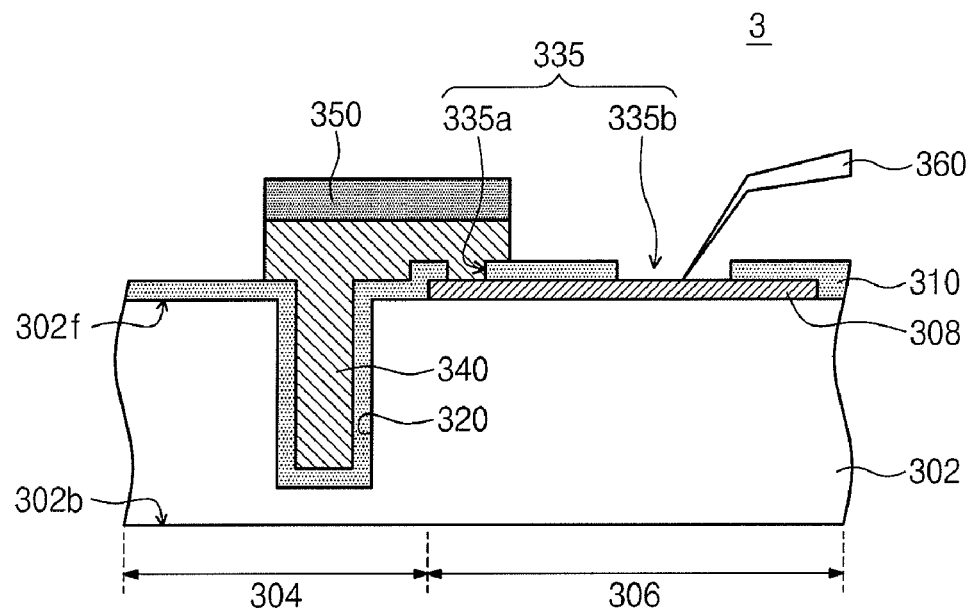

Referring to FIG. 7F, upon removal the mask 345, a semiconductor device 3 of a wafer unit may be formed. A probe 360 contacts the pad 308 exposed by the second opening 335b to perform an EDS test on the semiconductor device 3.

Figure 7G:
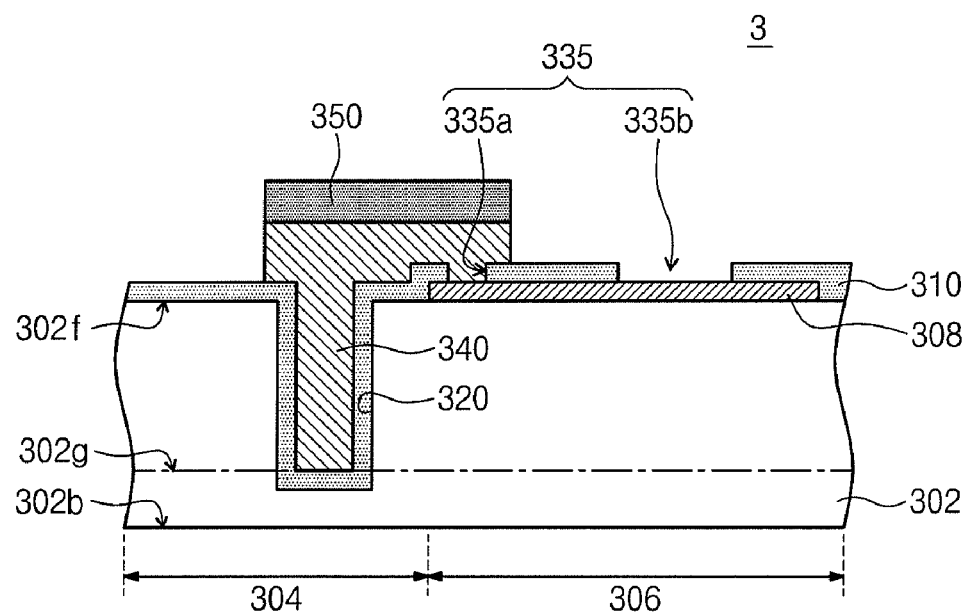

Referring to FIG. 7G, the backside 302b of the substrate 302 may be grinded at least up to a second backside 302g. In this case, the lower end of the through electrode 340 may be exposed through the second backside 302g. As another example, the lower end of the through electrode 340 may be protruded from the second backside 302g. The through electrode 340 may have a tapered cylindrical shape.

Figure 7H:
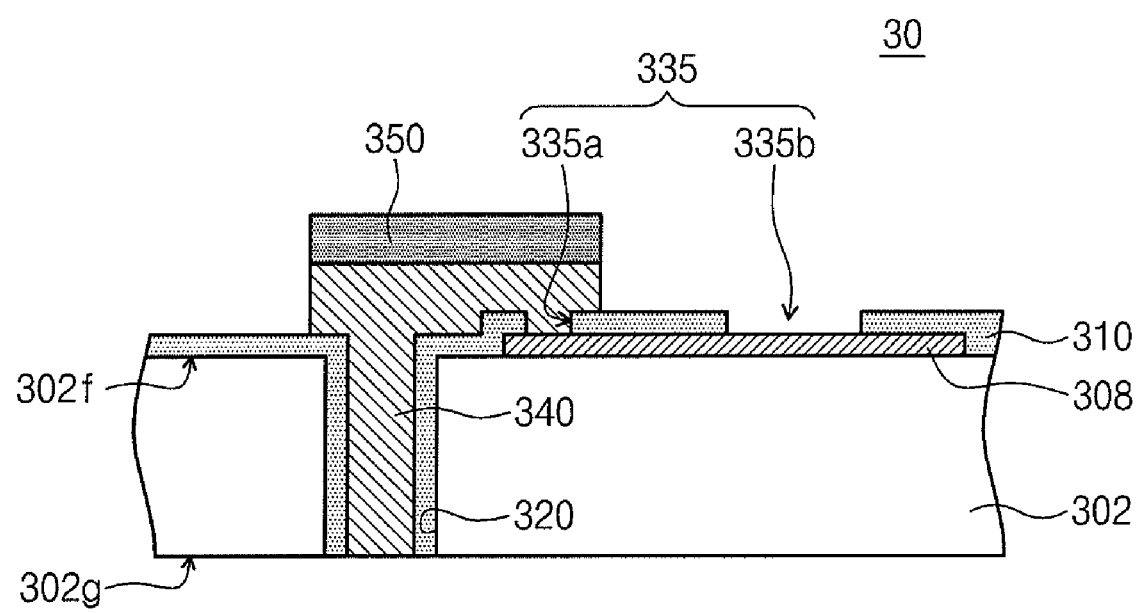

Referring to FIG. 7H, a semiconductor device 30 of a wafer unit including the through electrode 340 penetrating the substrate 302 may be implemented by the backside grinding process. Then, the semiconductor device 30 of the wafer unit may be separated through a sawing process.

Referring to FIG. 7I, a semiconductor chip 300 including the through electrode 340 penetrating a substrate 302s is singulated by the sawing process. The semiconductor chip 300 may include an electrical connection 370 including the through electrode 340 and the pad 308.

Figure 8A:
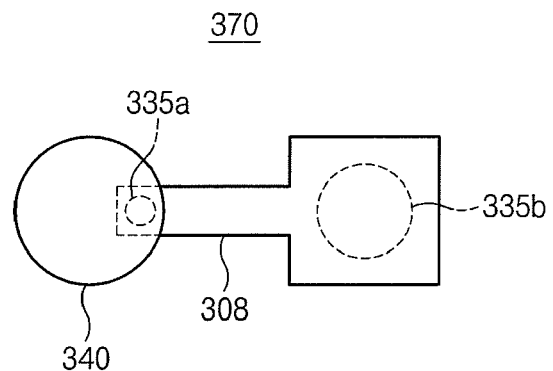
FIG. 8A is a plan view illustrating an electrical connection shown in FIG. 7I.
Figure 8B:
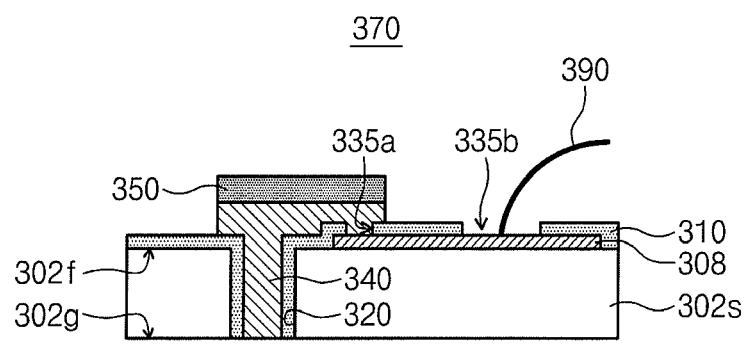
FIGS. 8B and 8C are cross-sectional views illustrating an electrical connection shown in FIG. 7I.
Figure 8C:
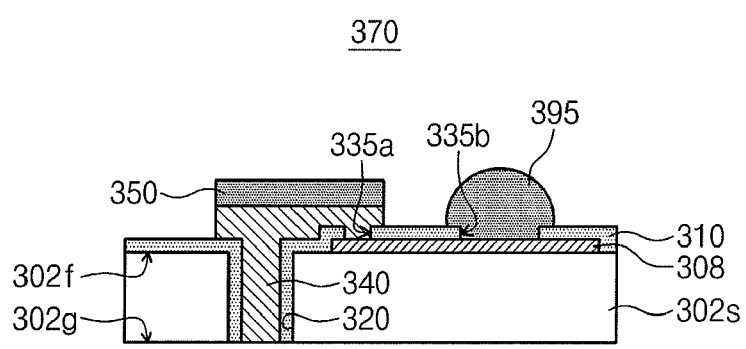

FIGS. 8A through 8C are diagrams illustrating a portion of FIG. 7I. FIG. 8A is a plan view illustrating an electrical connection shown in FIG. 7I. FIGS. 8B and 8C are cross-sectional views illustrating the electrical connection shown in FIG. 7I.

Referring to FIGS. 8A through 8C, the pad 308, as shown in FIG. 8B, may be electrically connected to a bonding wire 390 through the second opening 335b, or, as shown in FIG. 8C, may be electrically connected to a solder ball 395. Thus, the pad 308 may serve as a bonding pad and/or a redistribution pad.

Fourth Embodiment

FIGS. 9A through 9I are cross-sectional views illustrating a method for fabricating a semiconductor device according to a fourth embodiment of the inventive concept. Since the fourth embodiment are identical or similar to the first embodiment or the third embodiment, identical parts will be briefly described or omitted, and different parts will be fully described below.

Figure 9A:
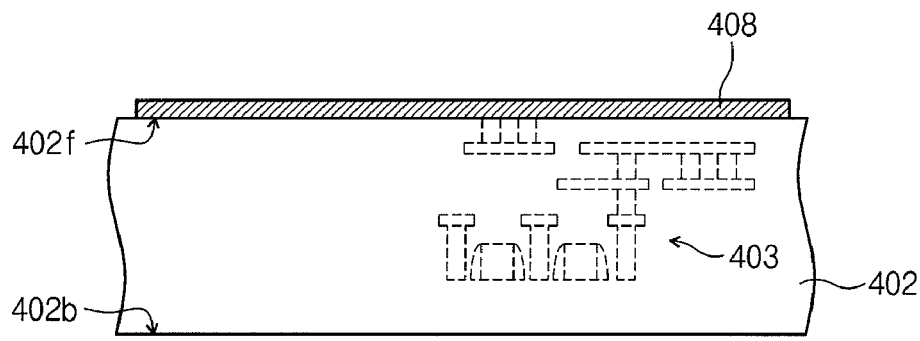
FIGS. 9A through 9I are cross-sectional views illustrating a method for fabricating a semiconductor device according to a fourth embodiment of the inventive concept.

Referring to FIG. 9A, a substrate 402 including an integrated circuit 403 may be provided. The substrate 402 may be a semiconductor substrate of a wafer unit having a front side 402f and a backside 402b opposite to the front side 402f. A pad 408 may be formed on the front side 402f to be electrically connected to the integrated circuit 403.

Figure 9B:
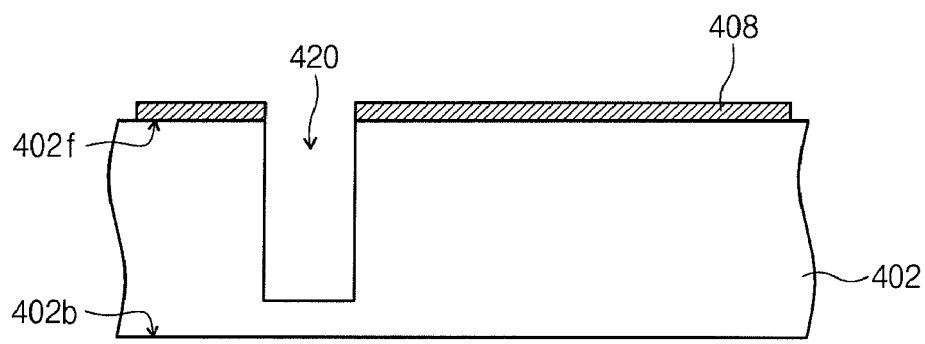

Referring to FIG. 9B, a through electrode via hole 420 may be formed in the substrate 402. For example, a portion of the substrate 402 may be removed through, for example, an etching process or a laser-drilling process to form the via hole 420. The via hole 420, in which a direct type through electrode (440 of FIG. 9E) is to be formed, may penetrate a portion of the pad 408. That is, the via hole 420 may be formed in a region of the substrate 402 in which the pad 408 is formed. The via hole 420 may be extended to the backside 402b of the substrate 402, or may not reach the backside 402b of the substrate 402. If the via hole 420 is extended to the backside 402b, a grinding or etching process for exposing an lower end of the through electrode (440 of FIG. 9G) may be omitted.

Figure 9C:
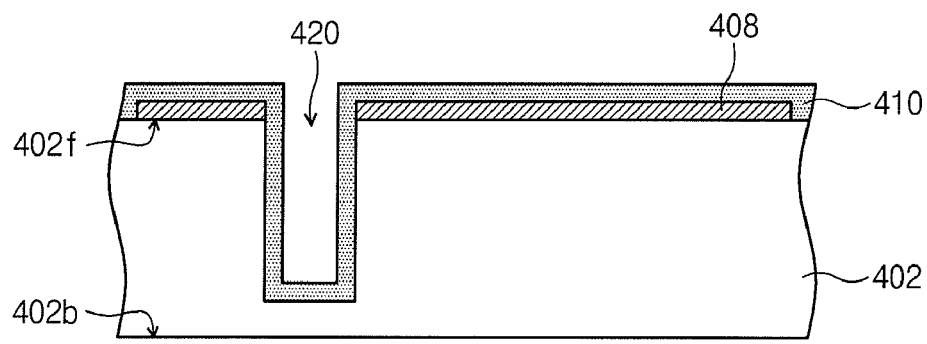

Referring to FIG. 9C, a passivation layer 410 may be formed on the substrate 402 through a deposition of an insulating material. The passivation layer 410 may cover the inner surface of the via hole 420 as well as the front side 402f of the substrate 402. Thus, a via hole insulating layer may not be formed, and thus all related processes for forming the via hole insulating layer may be omitted.

Figure 9D:
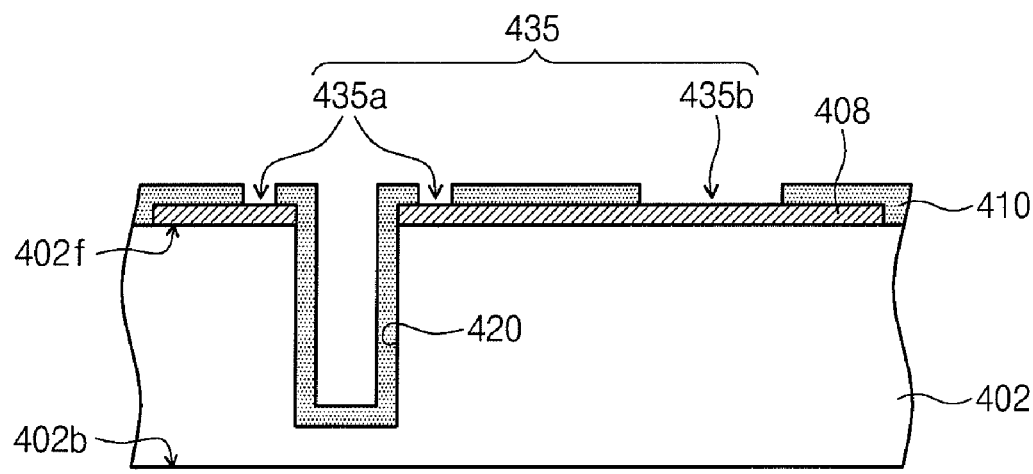

Referring to FIG. 9D, openings 435 may be formed to expose a portion of the pad 408. As an example, the openings 435 may include a first opening 435a extending through the passivation layer 410 to expose a portion of the pad 408 and a second opening 435b exposing another portion of the pad 408. The first opening 435a may have a ring shape surrounding the via hole 430. As another example, the passivation layer 410 formed around an upper region of the via hole 420 may be removed in the formation of the openings 435. Accordingly, a portion of the upper surface and the sidewall of the pad 408 around the via hole 420 may be exposed (not shown). In this case, the through electrode (440 of FIG. 9E) may directly contact the expose upper surface and sidewall of the pad 408.

Figure 9E:
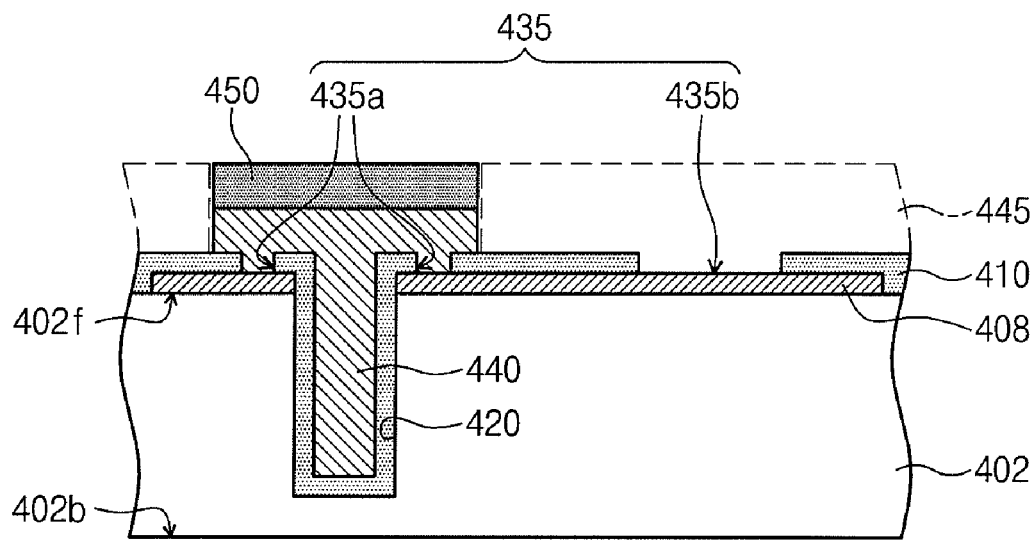

Referring to FIG. 9E, a through electrode 440 may be formed to fill the via hole 420 through an electroplating process using a mask 445. The through electrode 440 may be electrically connected to the pad 408 through the first opening 435a. A solder 450 may additionally be formed on the through electrode 440. As an example, the solder 450 may be formed through an electroplating process using the mask 445 used in the forming of the through electrode 440 without a separate photolithography process.

Figure 9F:
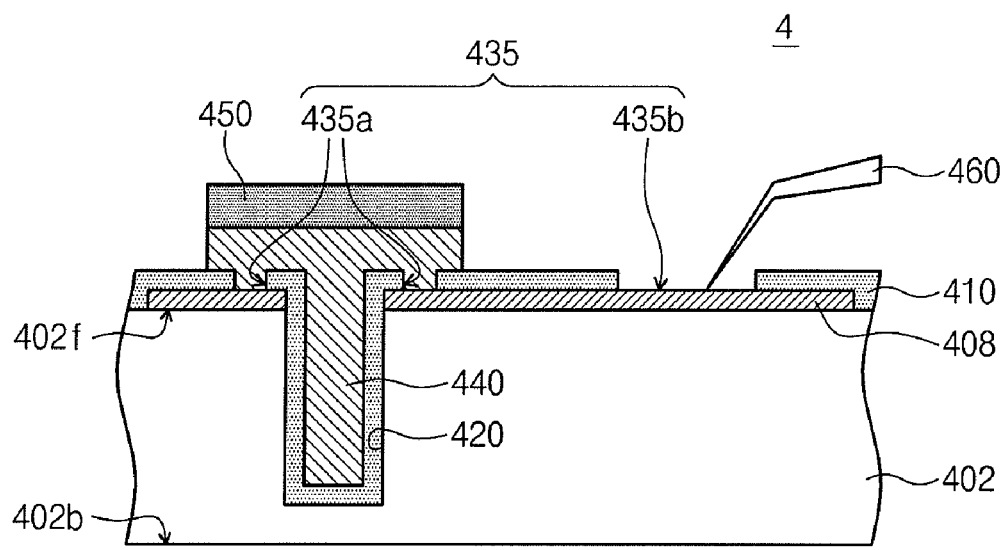

Referring to FIG. 9F, upon removal of the mask 445, a semiconductor device 4 of a wafer unit may be formed. A probe 460 contacts the pad 408 exposed by the second opening 435b to perform an EDS test on the semiconductor device 4.

Figure 9G:
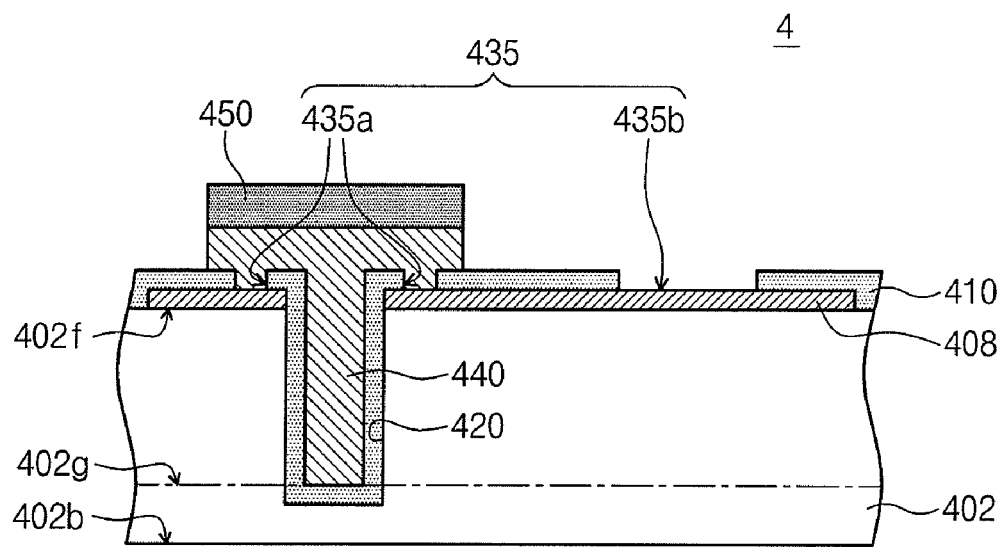

Referring to FIG. 9G, a grinding process may be performed on the backside 402b of the substrate 402. In this case, the backside grinding process may be performed up to a second backside 402g to expose a lower end of the through electrode 440. The lower end of the through electrode 440 may be protruded from the second backside 402g. The through electrode 440 may have a tapered cylindrical shape.

Figure 9H:
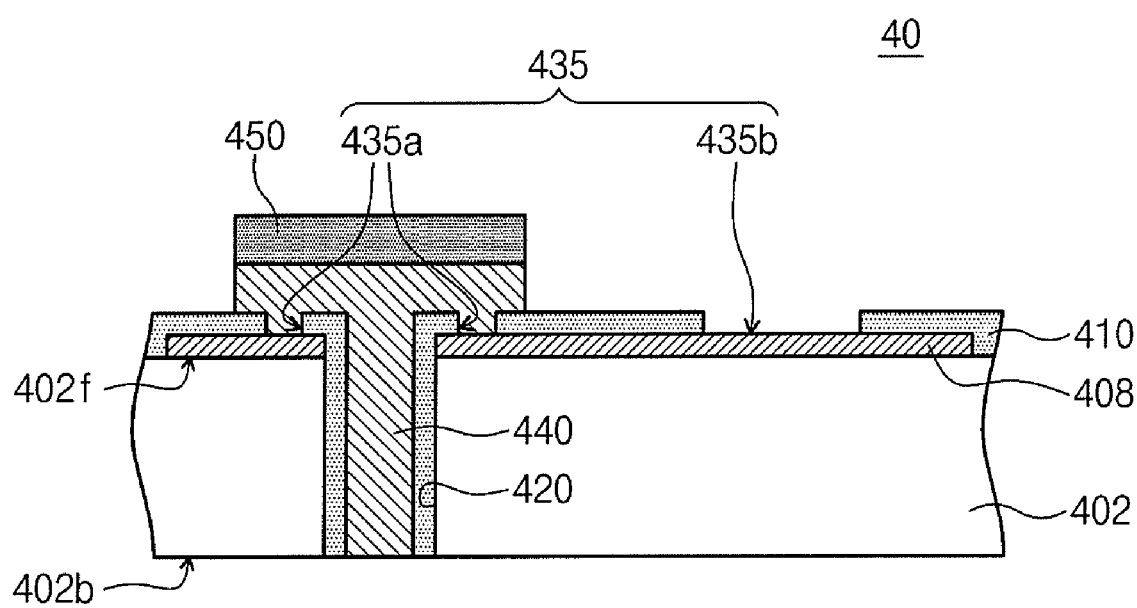

Referring to FIG. 9H, a semiconductor device 40 of a wafer unit including the through electrode 440 penetrating the substrate 402 may be implemented by the backside grinding process. Then, the semiconductor device 40 of the wafer unit may be separated through a sawing process.

Figure 9I:
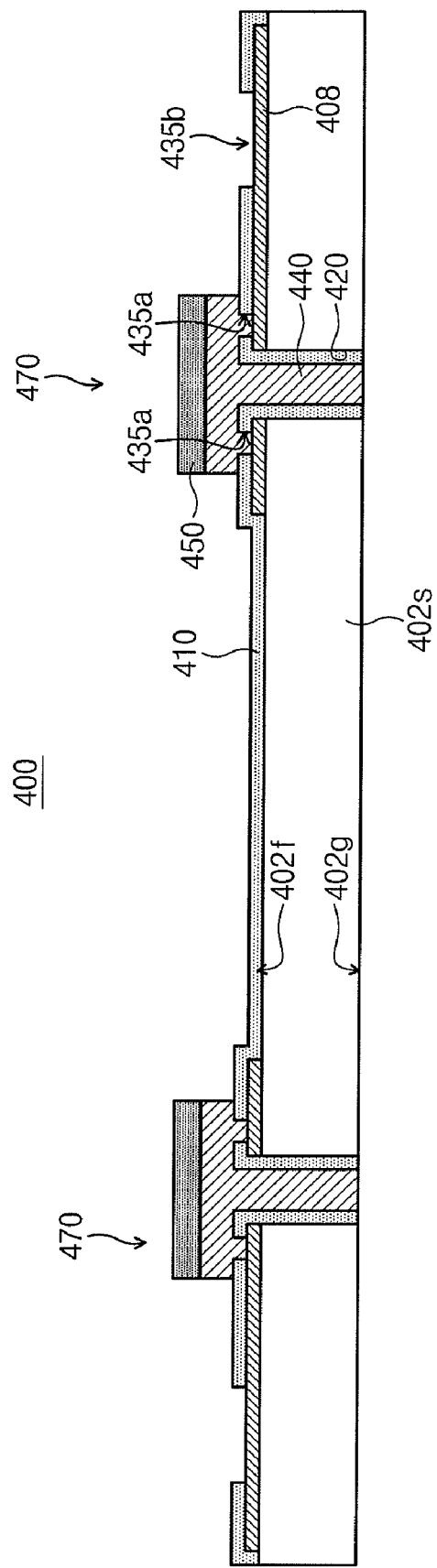

Referring to FIG. 9I, a semiconductor chip 400 including the through electrode 440 penetrating a substrate 402s is singulated by the sawing process. The semiconductor chip 400 may include an electrical connection 470 including the through electrode 440 and the pad 408.

Figure 10A:
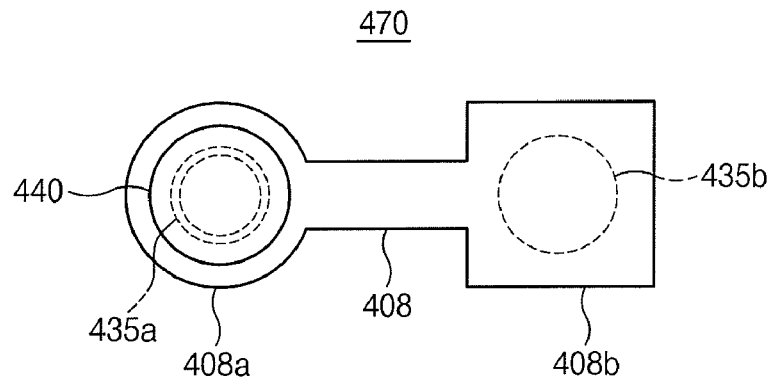
FIG. 10A is a plan view illustrating an electrical connection shown in FIG. 9I.
Figure 10B:
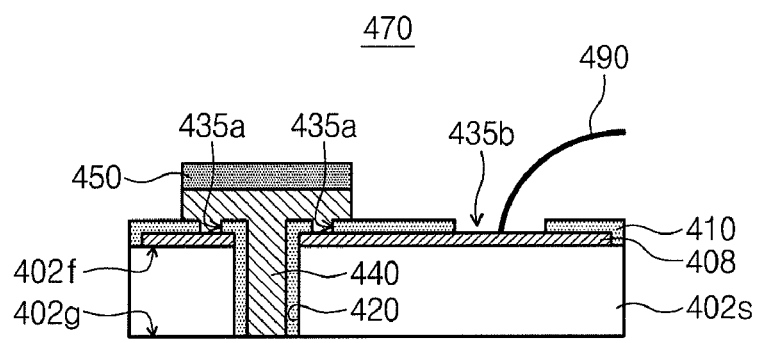
FIGS. 10B and 10C are cross-sectional views illustrating an electrical connection shown in FIG. 9I.
Figure 10C:
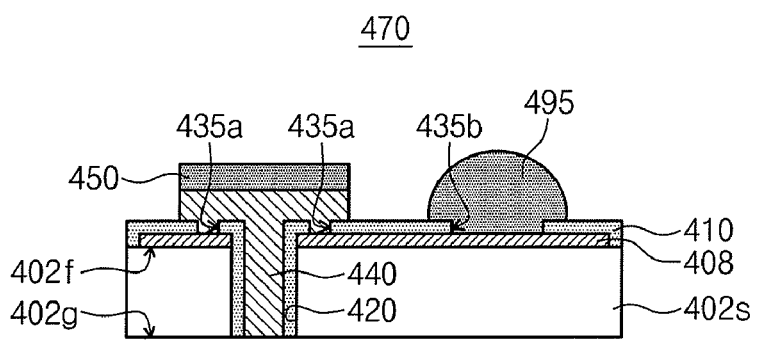

FIGS. 10A through 10C are diagrams illustrating a portion of FIG. 9I. FIG. 10A is a plan view illustrating an electrical connection shown in FIG. 9I. FIGS. 10B and 10C are cross-sectional views illustrating the electrical connection shown in FIG. 9I.

Referring to FIGS. 10A through 10C, the pad 408, as shown in FIG. 10B, may be electrically connected to a bonding wire 490 through the second opening 335b, or, as shown in FIG. 10C, the pad 408 may be electrically connected to a solder bump or a solder ball 495. As shown in FIG. 10A, the electrical connection 470 may be divided into a through electrode pad 408a electrically connected to the through electrode 440 through the first opening 435a and a bonding pad 408b bonded to a bonding wire 490 or a solder ball 495 through the second opening 435b. The pad 408 may serve as a bonding pad and/or a redistribution pad in the configuration of a multichip package described below.

Example of Semiconductor Package

Hereinafter, a semiconductor package in which semiconductor chips 400 according to the fourth embodiment of the inventive concept are vertically stacked will be described in detail. The semiconductor chips forming the semiconductor package are not limited to the semiconductor chips 400 according to the fourth embodiment, but include the semiconductor chips 100, 200 and 300.

Figure 11A:
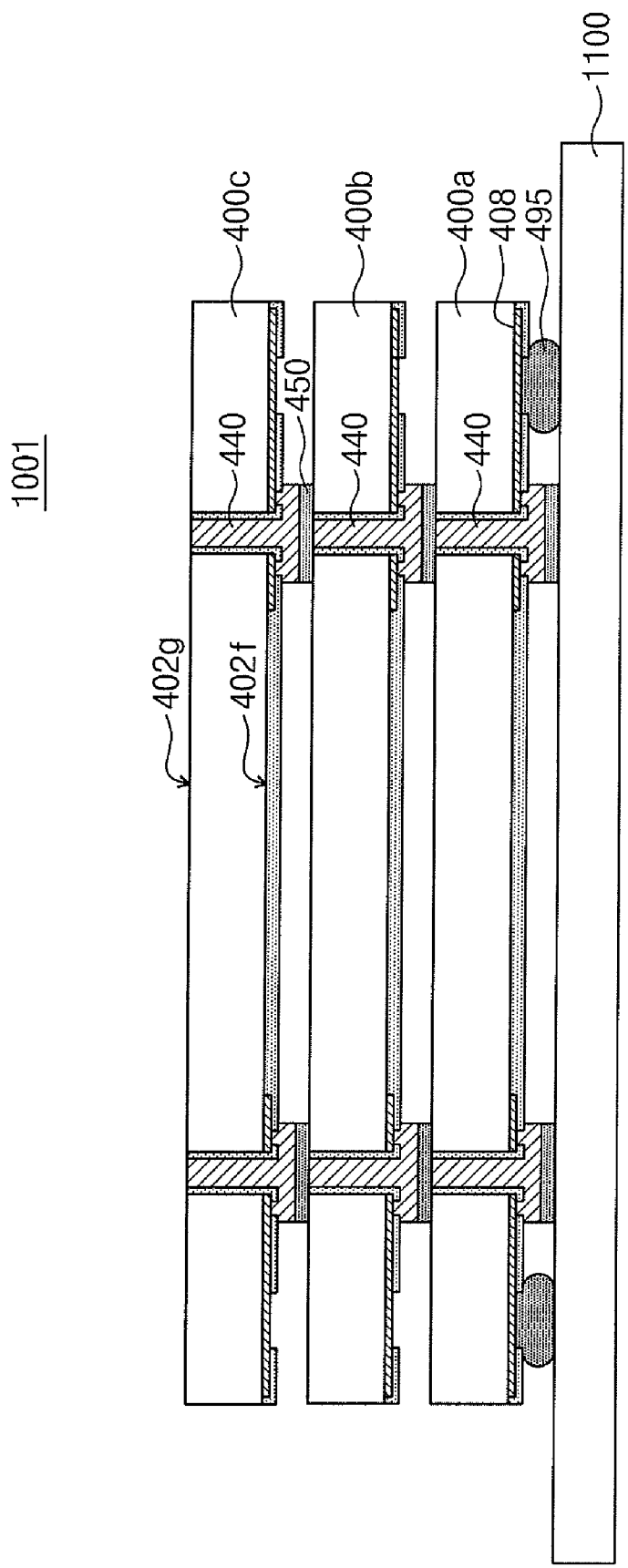
Figure 11B:
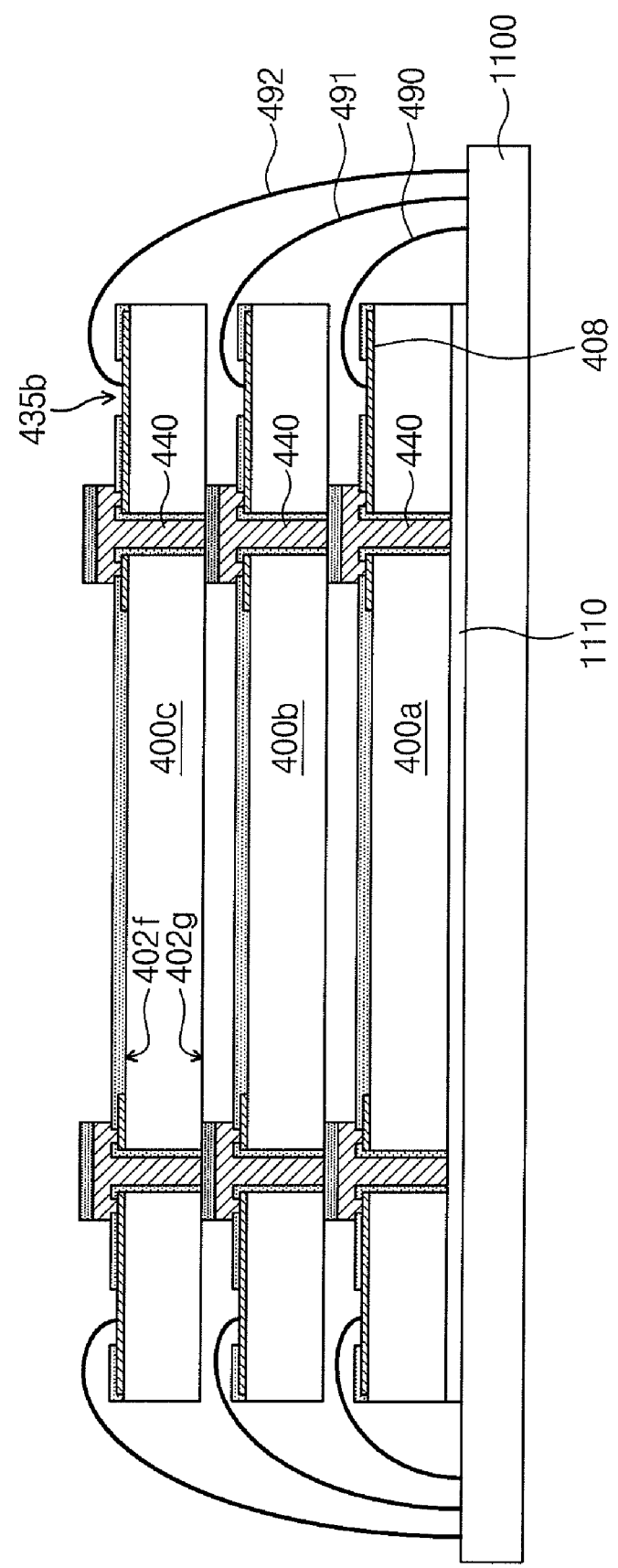
Figure 11C:
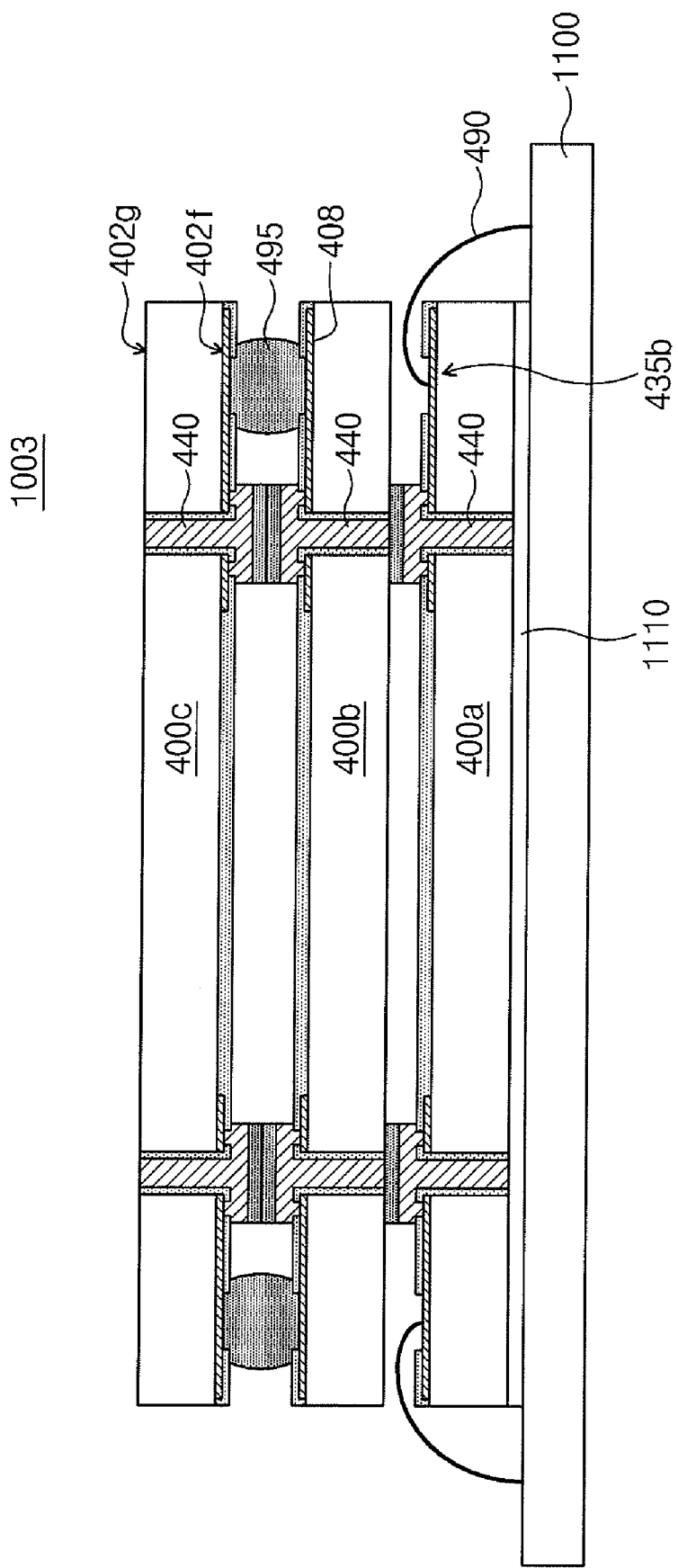
Figure 11E:
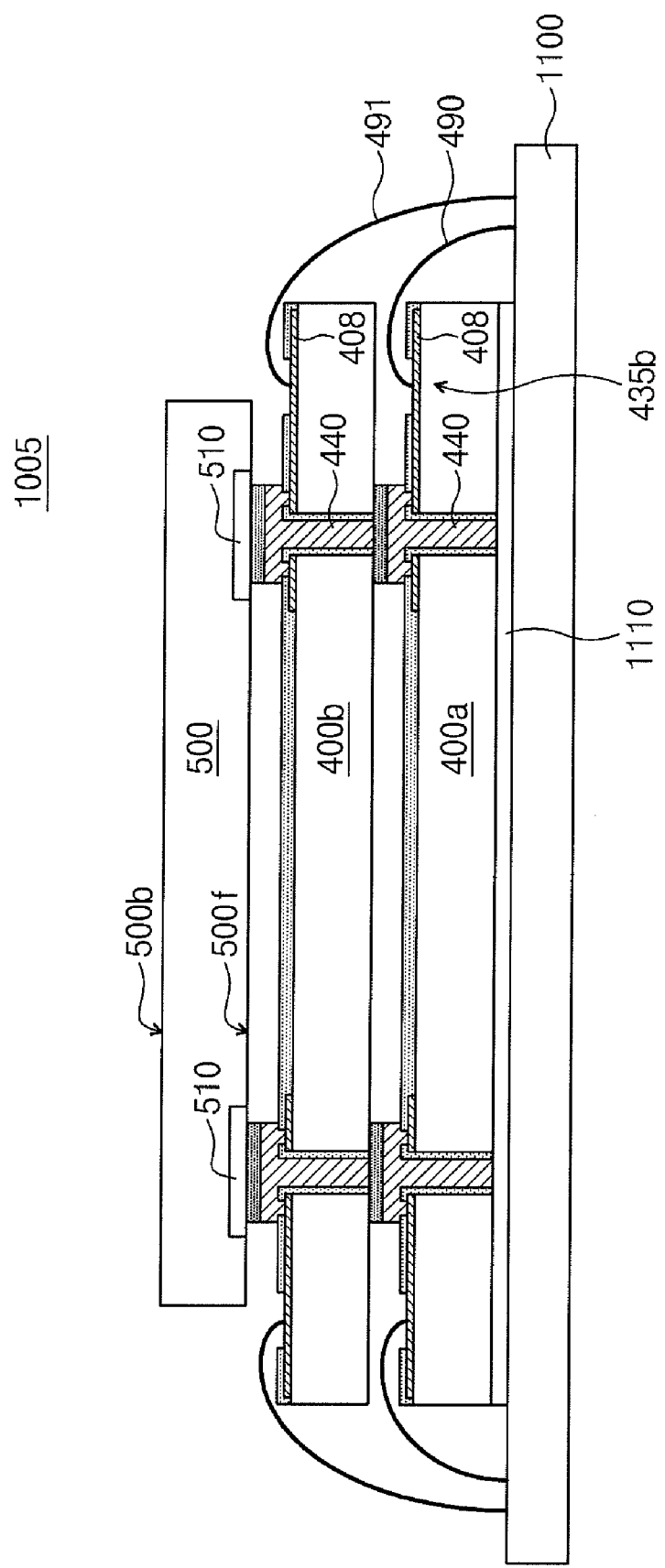
Figure 11F:
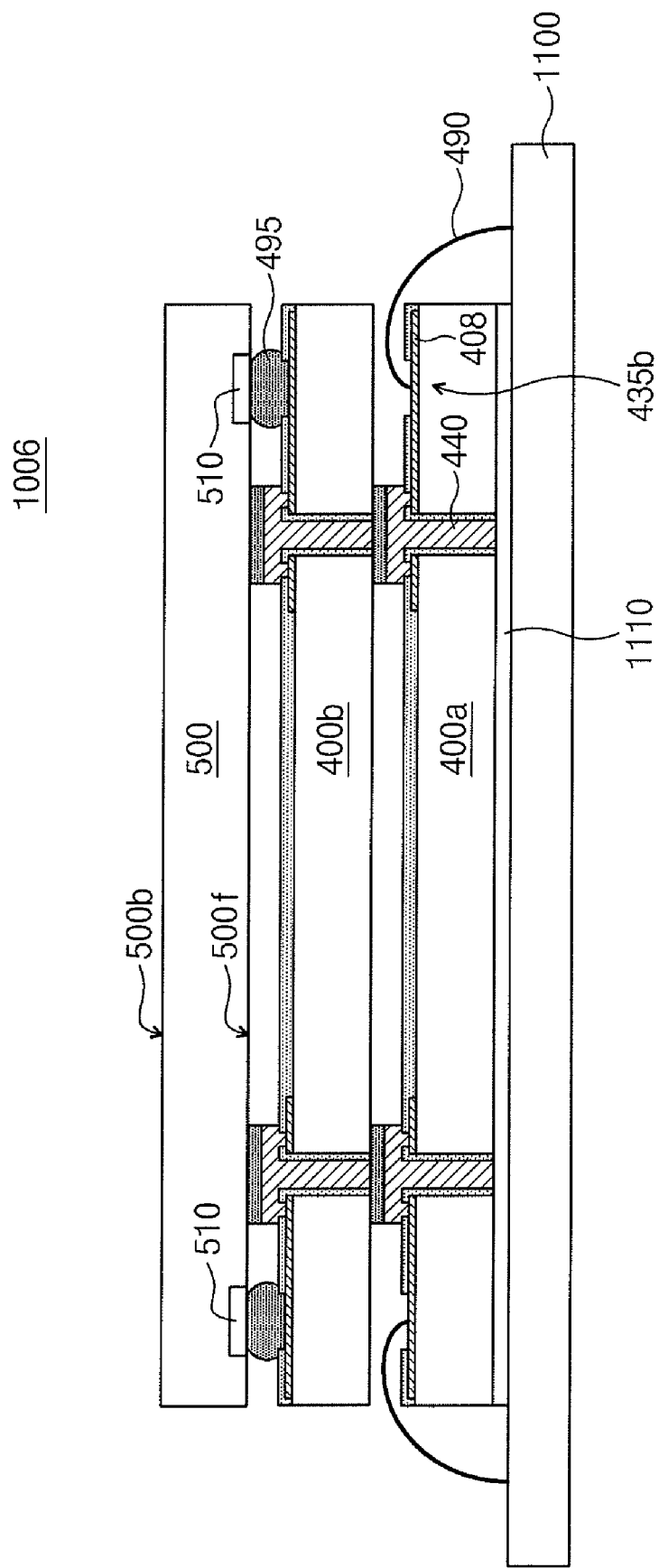
Figure 11H:
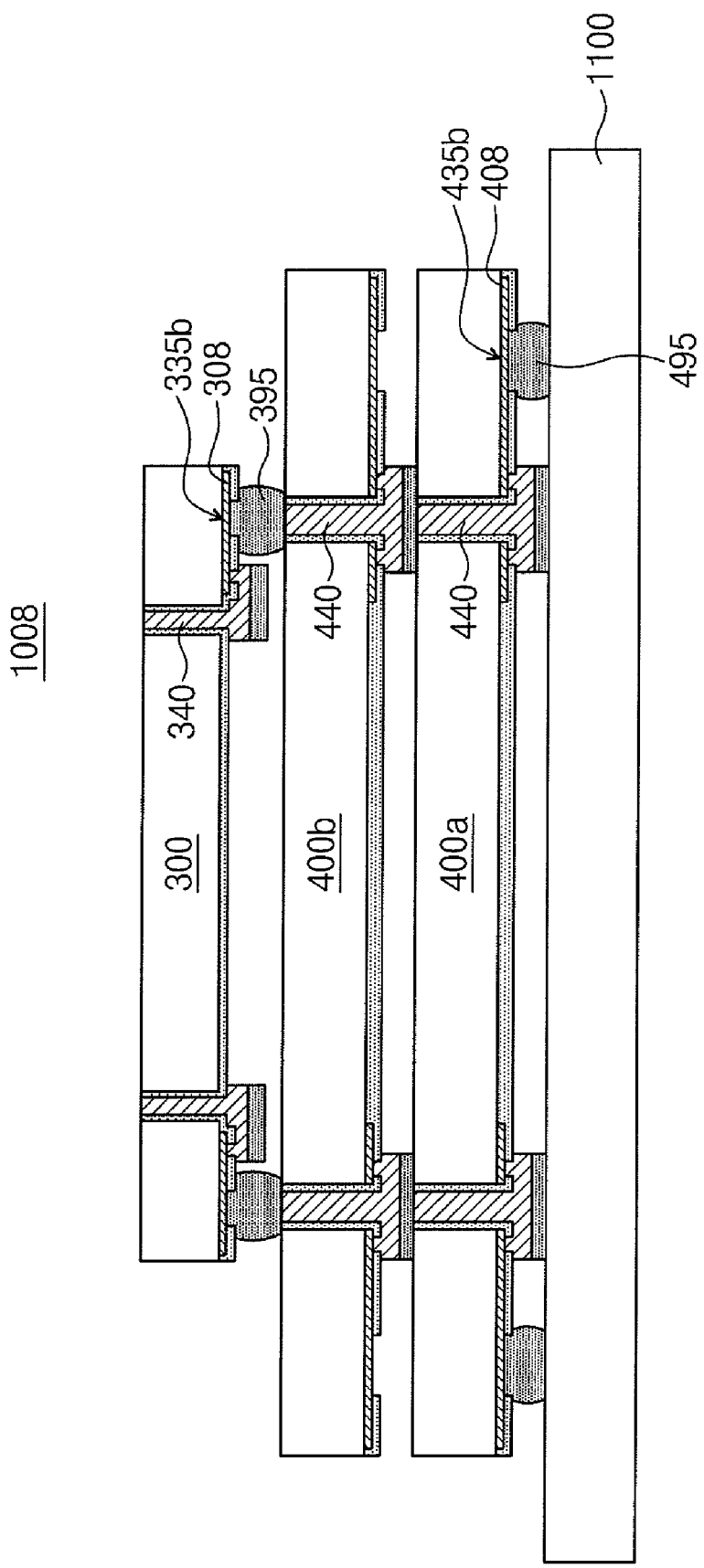
Figure 11I:
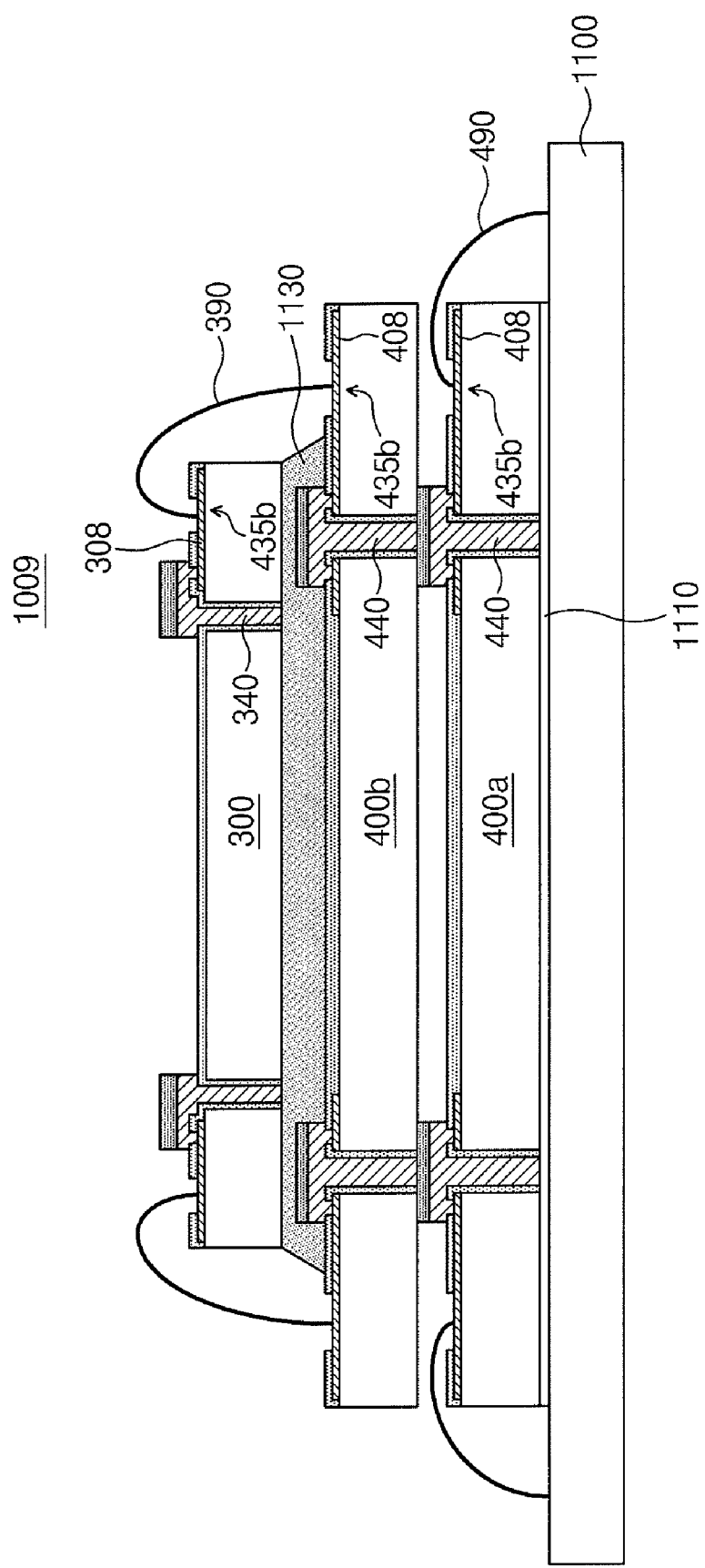

FIGS. 11A through 11I are cross-sectional views illustrating a semiconductor package having semiconductor device stacked therein according to an exemplary embodiment of the inventive concept. FIGS. 11A through 11C illustrate a semiconductor package having the same type of semiconductor chips stacked therein. FIGS. 11D through 11F illustrate a semiconductor package having different types of semiconductor chips stacked therein. FIGS. 11G through 11I illustrate through electrodes of semiconductor chips that are not vertically aligned.

The term 'the same type' means that the structures of semiconductor chips may be identical or similar to each other, and the term 'different types' means that the structures of semiconductor chips may be dissimilar to each other. The semiconductor chip may be a memory chip or a non-memory chip. Also, the sizes of the semiconductor chips may be identical to or different from each other.

Referring to FIG. 11A, a semiconductor package 1001 according to a first embodiment of the inventive concept may include a multichip package having first to third semiconductor chips 400a, 400b and 400c of the same type vertically stacked therein. The first to third semiconductor chips 400a, 400b and 400c are semiconductor chips 400 according to the fourth embodiment, which are discriminated by 400a, 400b and 400c merely for ease of explanation. The semiconductor package 1001 may further include a Printed Circuit Board (PCB) 1100 on which the first to third semiconductor chips 400a to 400c are mounted. The semiconductor chips 400a to 400c may be vertically stacked in a flip state where the front sides 402f thereof face the PCB 1100 and the backsides 402g face the opposite side thereto. The semiconductor chips 400a to 400c may be electrically connected to each other via through electrodes 440. The first semiconductor chip 400a may be electrically connected to the PCB 1100 via the through electrode 440. Thus, all semiconductor chips 400a to 400c may be electrically connected to the PCB 1100.

A solder ball 495 may additionally be provided to electrically connect the first semiconductor chip 400a to the PCB 110. The number of the through electrodes 440 may be insufficient when the first semiconductor chip 400a is electrically connected to the PCB 1100. In this case, as many solder balls 495 as needed can be connected to pads 408 of the first semiconductor chip 400a to compensate for the lacking through electrodes 440. For example, when an electrical connection between the first semiconductor chip 400a and the PCB 1100 requires M (e.g., four) through electrodes 440, but there are N (e.g., two) through electrodes 440, M–N (e.g., two) solder balls 495 may be used to achieve the electrical connection.

Referring to FIG. 11b, unlike the semiconductor package 1001 according to the first embodiment of the inventive concept, a semiconductor package 1002 according to a second embodiment of the inventive concept may include first to third semiconductor chips 400a to 400c of the same type vertically stacked such that the backsides 402g of the semiconductor chips 400a to 400c face a PCB 1100 and the front sides 402f thereof face the opposite side thereto. An insulating adhesive layer 1110 may be interposed between the backside 402g of the first semiconductor chip 400a and the PCB substrate 1100. The semiconductor chips 400a to 400c are electrically connected to the PCB substrate 1100 by bonding wires 490. For example, one end of the bonding wire 490 is connected to the PCB 1100, and the other end of the bonding wire 490 is connected to the pad 408 exposed by a second opening 435b. Second bonding wire 491 that electrically connect the pads 408 of the second semiconductor chip 400b to the PCB 1100 and/or third bonding wires 492 that electrically connect the pads 408 of the third semiconductor chip 400c to the PCB 1100 may be further provided. Thus, the pads 408 may serve as bonding pads to which the bonding wires 490 to 492 are connected.

The bonding wires 490 to 492 and the through electrodes 440 may be designed to perform different functions from each other. For example, the bonding wires 490 to 492 may be used as lines that do not require a high transmission rate, for example, power lines. In contrast, the through electrodes 440 may be used as lines that require a high transmission rate, for example, signal lines of integrated circuits. As another example, when it is difficult to achieve reliable electrical connections between the semiconductor chips 400a to 400c and the PCB 1100 using the through electrodes 440, or reliable electrical connections between the semiconductor chips 400a to 400c, the bonding wires 490 to 492 can implement reliable electrical connections. As still another example, the first semiconductor chip 400a and the PCB 1100 may be directly and electrically connected by protruded lower ends of the through electrodes 440 of the first semiconductor chip 400a, or solder balls or solder bumps connected to the lower ends of the through electrodes 440. The first and second semiconductor chips 400a to 400b are electrically connected to each other by the protruded lower ends of through electrodes 440.

Referring to FIG. 11C, a semiconductor package 1003 according to a third embodiment of the inventive concept may include first to third semiconductor chips 400a to 400c of the same type vertically stacked therein. Like the semiconductor package 1002 of the second embodiment, the semiconductor chip 400a and a PCB 1100 may be electrically connected by bonding wires 490. For example, one end of the bonding wire 490 is connected to the PCB 1100, and the other end of the bonding wire 490 is connected to the pad 408 (of the semiconductor chip 400a) exposed by a second opening 435b.

Unlike the semiconductor package 1002 of the second embodiment, the semiconductor chips 400a to 400c may be stacked to have different types. As an example, the first and second semiconductor chips 400a and 400b may be stacked in a front-to-back structure in which the front side 402f of the first semiconductor chip 400a faces the backside 402g of the second semiconductor chip 400b, and the second and third semiconductor chips 400b and 400c may be stacked in a front-to-front structure in which the front side 402f of the second semiconductor chips 400b faces the front side 402f of the third semiconductor chip 400c. Since the second semiconductor chip 400b and the third semiconductor chip 400c are stacked in the front-to-front structure, an electrical connection between the second semiconductor chip 400b and the third semiconductor chip 400c may also be implemented by solder balls 495. For example, the electrical connection between the second semiconductor chip 400b and the third semiconductor chip 400c can be implemented by the solder balls 495 that are simultaneously connected to the pads 408 of the second semiconductor chip 400b and the pads 408 of the third semiconductor chip 400c.

Referring to FIG. 11D, a semiconductor package 1004 according to a fourth embodiment of the inventive concept may include first and second semiconductor chips 400a and 400b of the same type that are stacked in a front-to-back structure on a PCB 1100, and a semiconductor chip 500 of different size and type that is stacked in a front-to-back structure on the second semiconductor chip 400b. Bonding pads 510 may be formed on the front side 500f of the different-type semiconductor chip 500. The stack structure and electrical connection of the same-type first and second semiconductor chips 400a and 400b may be identical or similar to those of the semiconductor package 1003 of the third embodiment. For example, an electrical connection between the first and second semiconductor chips 400a and 400b and the PCB 1100 may be implemented by bonding wires 490 electrically connecting the first semiconductor chip 400a to the PCB 1100. Bonding wires 491 connected to the pads 408 of the second semiconductor chip 400b exposed by second openings 435b may be connected to the bonding pads 510 of the different type semiconductor chip 400 to implement an electrical connection between the second semiconductor chip 400b and the different type semiconductor chip 500. An insulating adhesive layer 1120 for insulation from the through electrode 440 may be further formed on the backside 500b of the different type semiconductor chip 500. The pad 408 of the second semiconductor chip 400b may serve as a bonding pad to which the bonding wire 491 is connected, and also serve as a redistribution pad for electrical connection to the bonding pad 510 of the different type semiconductor chip 500.

Referring to FIG. 11E, semiconductor package 1005 according to a fifth embodiment of the inventive concept may include first and second semiconductor chips 400a and 400b of the same type that are stacked in a front-to-back structure on a PCB 1100, and a semiconductor chip 500 of a different type that are stacked in a front-to-front structure on the second semiconductor chip 400b. Pads 510 of the different type semiconductor chip 500 may be connected to the through electrodes 440 of the second semiconductor chip 400b. The first semiconductor chip 400a may be electrically connected to the PCB 1100 through bonding wires 490. The semiconductor package 1005 may include second boding wires 491 that electrically connect the second semiconductor chip 400b to the PCB 1100.

Referring to FIG. 11F, a semiconductor package 1006 according to a sixth embodiment of the inventive concept may include a stack structure identical or similar to that of the semiconductor package 1005 of the fifth embodiment. Unlike the semiconductor package 1005, bonding pads 510 of a different type semiconductor chip 500 and the through electrodes 440 of the second semiconductor chip 400b may not be vertically aligned. In this case, solder balls 495 connected to the pads 408 of the second semiconductor chip 400b exposed by the second openings 435b may be connected to the bonding pads 510 of the different type semiconductor chip 500 to realize electrical connection to the different type semiconductor chip 500. Thus, the pad 408 of the second semiconductor chip 400 may serve as a redistribution pad.

Referring to FIG. 11G, a semiconductor package 1007 according to a seventh embodiment of the inventive concept may include a stack structure identical or similar to that of the semiconductor package 1001 of the first embodiment. As an example, first and second semiconductor chip 400a and 400b electrically connected to each other via the through electrode 440 may be vertically stacked in a flip state on a PCB 110. An electrical connection between the first semiconductor chip 400a and the PCB 1100 may be implemented by the through electrodes 440 and/or the solder balls 495. The semiconductor chip 300 of the third embodiment shown in FIG. 7I may be stacked on the second semiconductor chip 400b in a front-to-back structure. As another example, the semiconductor chips 300, 400a and 400b may be stacked in a structure substantially identical or similar to that of the semiconductor package 1002 of the second embodiment.

Assume that the second semiconductor chip 400b and the semiconductor chip 300 have substantially the same size, and that the pad 408 of the second semiconductor chip 400b and the pad 408 of the semiconductor chip 300 have substantially the same size and position. In this case, since the through electrode 440 of the second semiconductor chip 400b is the direct type, and a through electrode 340 of the semiconductor chip 300 is not the direct type, the through electrode 340 and the through electrode 440 may not be vertically aligned with each other, and thus may not be directly connected to each other. Accordingly, an electric conductor 392 may be interposed between the through electrode 340 and the through electrode 440 to electrically connect the through electrode 340 to the through electrode 440. The electric conductor 392 may include a solder or a metal. As another example, when an upper end of the through electrode 340 is extended to a lower end of the through electrode 440, the through electrodes 340 and 440 may be directly connected to each other.

Referring to FIG. 11H, a semiconductor package 1008 according to an eighth embodiment of the inventive concept may include semiconductor chips 300 to 400b that are vertically stacked on a PCB 1100 like the semiconductor package 1007 of the seventh embodiment. Unlike the semiconductor package 1007 of the seventh embodiment, a semiconductor chip 300 may be electrically connected to the second semiconductor chip 400b through the solder ball 395 instead of a through electrode 340. The solder ball 395 may be connected to a pad 308 exposed by a second opening 335b. This example may be useful when the second opening 335b of the semiconductor chip 300 is substantially and vertically aligned with the through electrode 440.

Referring to FIG. 11I, a semiconductor package according to a ninth embodiment of the inventive concept may include semiconductor chips 300 to 400b that are stacked on a PCB in a substantially identical or similar shape to that of the semiconductor package 1002 of the second embodiment. As an example, an insulating adhesive layer 1110 is disposed on the PCB 1100, and the first semiconductor chip 400a is provided on the insulating adhesive layer 1110. The first semiconductor chip 400a may be electrically connected to the PCB through bonding wires 490 connected to the pads 408 exposed by the second openings 435b. As another example, the first semiconductor chip 400a may be electrically connected to the PCB 1100 by protruded lower ends of the through electrodes 440 of the first semiconductor chip 400a, or solder balls or solder bumps. The second semiconductor chip 400b may be vertically stacked on the first semiconductor chip 400a, and the first and second semiconductor chips 400a and 400b may be electrically connected to each other by the through electrodes 440. The semiconductor chip 300 may be vertically stacked on the second semiconductor chip 400b. Through electrodes 340 of the semiconductor chip 300 and the through electrodes 440 of the second semiconductor chip 400b may not be vertically aligned with each other, and thus may not be directly connected to each other. In this case, the semiconductor chip 300 and the second semiconductor chip 400b may be electrically connected to each other through bonding wires 390 connecting between pads 308 of the semiconductor chip exposed by second openings 335b and the pads 408 of the second semiconductor chip 400b exposed by second openings 435b. An under-filling layer 1130 may be formed between the semiconductor chip 300 and the second semiconductor chip 400b to prevent a physical contact therebetween and an undesired electrical connection or short.

Application Example

Figure 12A:
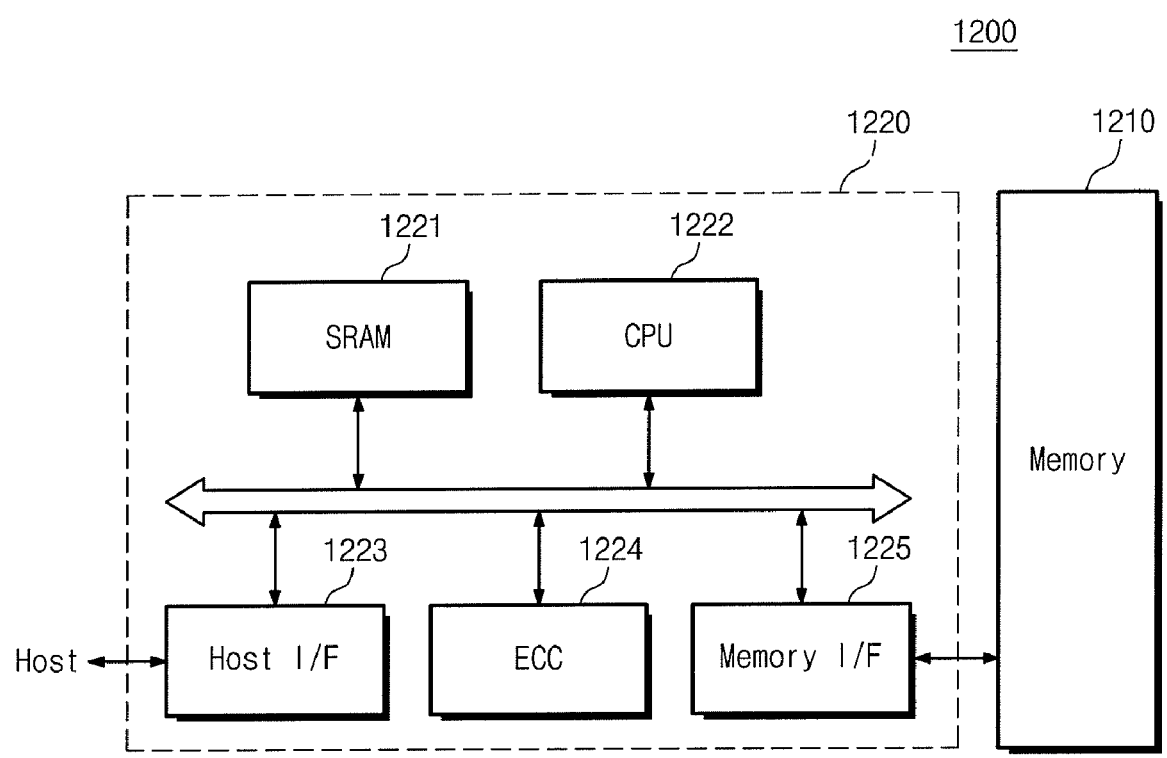
FIG. 12A is a block diagram illustrating a memory card applied with a semiconductor device according to an exemplary embodiment of the inventive concept.

FIG. 12A is a block diagram illustrating a memory card applied with a semiconductor device according to an exemplary embodiment of the inventive concept.

Referring to FIG. 12A, the semiconductor devices according to various embodiments described above, for example, a semiconductor memory 1210, may be used in a memory card 1200. As an example, the memory card 1200 may include a memory controller 1220 that controls data exchanges between a host (not illustrated) and the memory 1210. An SRAM 1221 is used as a working memory of a central processing unit (CPU) 1222. A host interface (I/F) 1223 may include a data exchange protocol of the host that is connected to the memory card 1200. An error correction code (ECC) 1224 may detect and correct errors in data read from the memory 1210. A memory interface (I/F) 1225 interfaces with the memory 1210. The CPU 1222 performs overall control operations for data exchanges of the memory controller 1220.

Figure 12B:
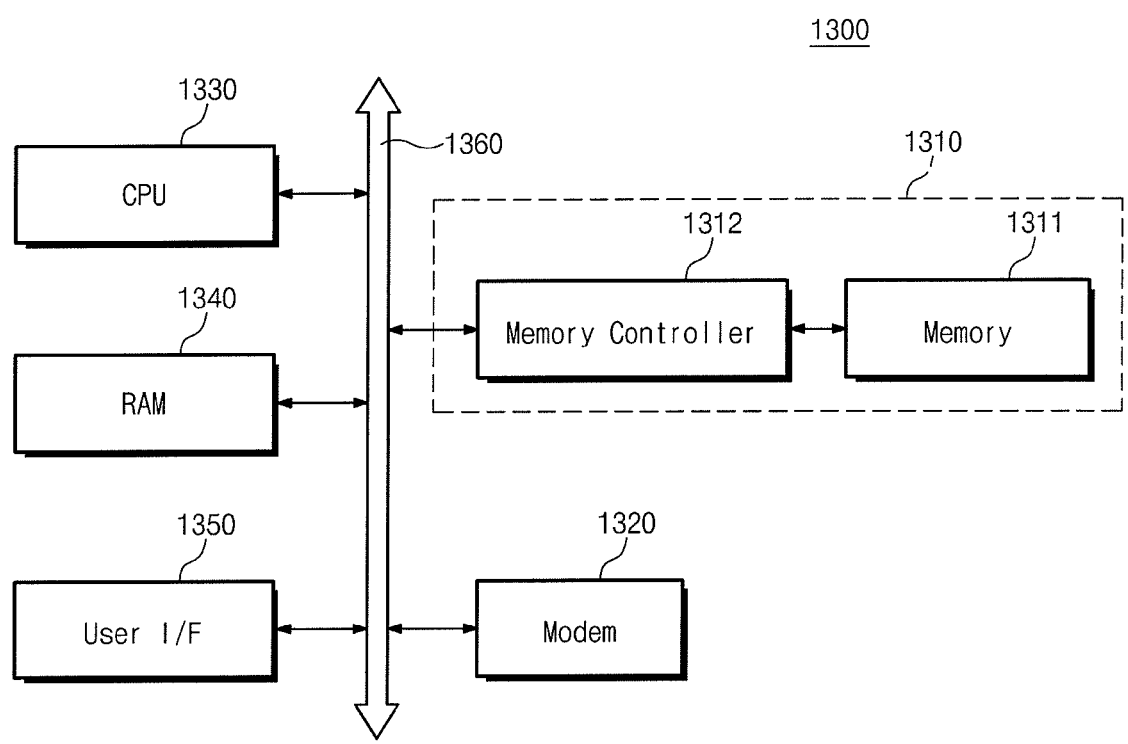
FIG. 12B is a block diagram illustrating an information processing system applied with semiconductor devices according to exemplary embodiments of the inventive concept.

FIG. 12B is a block diagram illustrating an information processing system employing semiconductor devices according to exemplary embodiments of inventive concept.

Referring to FIG. 12B, the information processing system may include a memory system 1310 provided with semiconductor devices according to the exemplary embodiments of the inventive concept. For example, the information processing system 1300 includes a memory system 1310, a modem 1320, a central processing unit (CPU) 1330, a RAM 1340, and a user interface 1350 that are electrically connected to a system bus 1360, respectively. The memory system 1310 may include a memory 1311 and a memory controller 1312, and may have the substantially same configuration as the memory card 1200 of FIG. 12A. Data processed by the CPU 1330 or inputted from the outside may be stored in the memory system 1310. The information processing system 1300 may be provided using a memory card, a solid state disk, a camera image sensor, and other application chipsets. As an example, the flash memory system 1310 may be implemented in the solid state disk (SSD). In this case, the information processing system 1300 can stably and reliably store high-capacity data in the memory system 1310.

Semiconductor devices according to the exemplary embodiments of the inventive concept may be packaged in various types. Examples of the packages of the semiconductor devices according to the exemplary embodiments of the inventive concept include Package on Package (PoP), Ball Grid Arrays (BGAs), Chip Scale Packages (CSPs), Plastic Leaded Chip Carrier (PLCC), Plastic Dual In-line Package (PDIP), Multi Chip Package, Wafer Level Package, Wafer Level Fabricated Package, Wafer Level Stack Package, Die in Waffle Package, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), and System In Package (SIP).

Semiconductor devices and methods for fabricating the same according to the exemplary embodiments of the inventive concept can be variously applied to semiconductor industries and manufacturing industries that manufacture electronic production using semiconductor devices.

According to the exemplary embodiments of the inventive concept, a pad can be used as a test pad during fabrication process, and may be used as a bonding pad and/or a re-interconnection pad after fabrication of a semiconductor chip. Since the pad can be used for multipurpose, an electrical connection can be facilitated, particularly, in a packaging process. Since a solder having the same size as a through electrode can be formed in self-alignment with the through electrode without a separate photolithography process, a solder process can be omitted. Furthermore, since a passivation process is performed after a through electrode via hole process, a separate via hole insulating layer process is not required, thereby simplifying the overall manufacturing process and reducing the process cost.

In those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.).

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
   a substrate having a front side on which a pad is disposed and a backside opposite to the front side, the substrate having a via hole penetrating therethrough;

a through electrode at least partially filling the via hole and having an upper end protruding from the front side; and an insulating layer to insulate the through electrode from the substrate, the insulating layer comprising a first opening extending through the insulating layer, through which a portion of the pad is connected to the through electrode, and a second opening exposing another portion of the pad, wherein the first opening exposes a first portion of the pad adjacent to the through electrode, the second opening exposes a second portion of the pad spaced apart from the through electrode, and the first and second portions of the pad extend from each other to be connected to each other in a continuous structure.

2. The semiconductor device of claim 1, wherein a portion of the through electrode extends through the first opening and is connected to the exposed first portion of the pad, and wherein an external terminal is connected to the second portion of the pad through the second opening.

3. The semiconductor device of claim 2, wherein the pad comprises:
a through electrode pad comprising the first portion of the pad to be connected to the through electrode; and
a bonding pad comprising the second portion of the pad to be connected to the external terminal.

4. The semiconductor device of claim 1, wherein the insulating layer comprises:
a passivation layer covering the pad; and
a via hole insulating layer covering the passivation layer and an inner surface of the via hole.

5. The semiconductor device of claim 1, wherein the insulating layer comprises a passivation layer covering the pad and an inner surface of the via hole.

6. The semiconductor device of claim 1, further comprising a solder on the through electrode, the solder being in self-alignment with the through electrode, wherein the solder covers an entire surface of the through electrode.

7. A semiconductor device comprising:
a first semiconductor chip comprising a first through electrode and a first pad connected to the first through electrode, a first portion and a second portion of the first pad being exposed through separate openings in an insulating layer on the first semiconductor chip, wherein the first and second portions of the pad extend from each other to be connected to each other in a continuous structure; and
a second semiconductor chip stacked on the first semiconductor chip and comprising a second through electrode and a second pad connected to the second through electrode, a portion of the second pad being exposed,
wherein the first and second through electrodes are connected to electrically connect the first and second semiconductor chips to each other.

8. The semiconductor device of claim 7, further comprising a connection terminal that electrically connects the first pad to the second pad.

9. The semiconductor device of claim 8, further comprising a third semiconductor chip stacked on the second semiconductor chip,
wherein the second and third semiconductor chips are electrically connected by at least one of the connection terminal connected to the second pad and the second through electrode.

10. The semiconductor device of claim 8, further comprising a printed circuit board on which the first semiconductor chip is disposed,
wherein the first semiconductor chip and the printed circuit board are electrically connected by at least one of the first through electrode and the connection terminal connected to the first pad.

11. The semiconductor device of claim 7, further comprising a solder on the first through electrode, the solder being in self-alignment with the first through electrode, wherein the solder covers an entire surface of the first through electrode.

* * * * *